(12) United States Patent
Yao et al.

(10) Patent No.: US 11,417,750 B2
(45) Date of Patent: Aug. 16, 2022

(54) GATE AIR SPACER FOR FIN-LIKE FIELD EFFECT TRANSISTOR

(71) Applicant: Taiwan Semiconductor Manufacturing Co., Ltd., Hsin-Chu (TW)

(72) Inventors: Chien Ning Yao, Hsinchu (TW); Bo-Feng Young, Taipei (TW); Sai-Hooi Yeong, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/122,721

(22) Filed: Dec. 15, 2020

(65) Prior Publication Data

US 2021/0242324 A1 Aug. 5, 2021

Related U.S. Application Data

(60) Provisional application No. 62/968,344, filed on Jan. 31, 2020.

(51) Int. Cl.
*H01L 29/49* (2006.01)
*H01L 29/08* (2006.01)
(Continued)

(52) U.S. Cl.
CPC .... *H01L 29/4991* (2013.01); *H01L 21/28123* (2013.01); *H01L 29/0847* (2013.01);
(Continued)

(58) Field of Classification Search
CPC ......... H01L 21/28123; H01L 21/28141; H01L 21/823431; H01L 21/823821; H01L 21/845; H01L 27/0886; H01L 27/0924; H01L 27/10879; H01L 27/1211; H01L 29/0649; H01L 29/0653; H01L 29/0847; H01L 29/41791; H01L 29/4991; H01L 29/6653; H01L 29/66545; H01L 29/66553; H01L 29/6656; H01L 29/66795; H01L 29/7848; H01L 29/785; H01L 29/7851; H01L 29/7853; H01L 29/7855
See application file for complete search history.

(56) References Cited

U.S. PATENT DOCUMENTS 6,180,988 B1 * 1/2001 Wu ..................... H01L 21/2257
257/410
6,548,362 B1 * 4/2003 Wu ..................... H01L 21/76895
257/E21.149
(Continued)

*Primary Examiner* — David C Spalla
(74) *Attorney, Agent, or Firm* — Haynes and Boone, LLP

(57) ABSTRACT

Fin-like field effect transistors (FinFETs) and methods of fabrication thereof are disclosed herein. The FinFETs disclosed herein have gate air spacers integrated into their gate structures. An exemplary transistor includes a fin and a gate structure disposed over the fin between a first epitaxial source/drain feature and a second epitaxial source/drain feature. The gate structure includes a gate electrode, a gate dielectric, and gate air spacers disposed between the gate dielectric and sidewalls of the gate electrode.

20 Claims, 20 Drawing Sheets

(51) Int. Cl.
    *H01L 29/417* (2006.01)
    *H01L 29/78* (2006.01)
    *H01L 21/28* (2006.01)
    *H01L 29/66* (2006.01)

(52) U.S. Cl.
    CPC .. *H01L 29/41791* (2013.01); *H01L 29/66545* (2013.01); *H01L 29/66795* (2013.01); *H01L 29/7848* (2013.01); *H01L 29/7851* (2013.01)

(56) References Cited

U.S. PATENT DOCUMENTS

| | | |
|---|---|---|
| 8,637,930 B2 | 1/2014 | Ando et al. |
| 9,252,233 B2 | 2/2016 | Hsiao et al. |
| 9,608,065 B1 | 3/2017 | Bergendahl et al. |
| 10,366,915 B2 | 7/2019 | Chang et al. |
| 10,522,642 B2 | 12/2019 | Lee et al. |
| 10,832,962 B1 | 11/2020 | Cheng et al. |
| 2005/0037585 A1* | 2/2005 | Park .................... H01L 29/6656 438/305 |
| 2008/0087916 A1* | 4/2008 | Amasuga ............ H01L 29/0649 257/194 |
| 2016/0365426 A1* | 12/2016 | Ching ................. H01L 29/7851 |
| 2017/0162650 A1* | 6/2017 | Cheng ............... H01L 29/66795 |
| 2017/0194423 A1 | 7/2017 | Lin |
| 2019/0393335 A1 | 12/2019 | Economikos et al. |
| 2021/0119010 A1* | 4/2021 | Yeong ............... H01L 29/66795 |
| 2021/0249519 A1* | 8/2021 | Yao ................... H01L 29/41791 |

\* cited by examiner

GATE AIR SPACER FOR FIN-LIKE FIELD EFFECT TRANSISTOR

This application is a non-provisional application of and claims benefit of U.S. Provisional Patent Application Ser. No. 62/968,344, filed Jan. 31, 2020, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), parasitic capacitance arising from gate-to-source/drain capacitance and gate-to-source/drain contact capacitance has been observed to account for an increasing portion of a total parasitic capacitance of FinFETs, and these observed parasitic capacitances tend to increase as IC technology nodes decrease. Consequently, not all advantages of FinFETs can be realized. Solutions are needed for reducing parasitic capacitance in FinFETs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
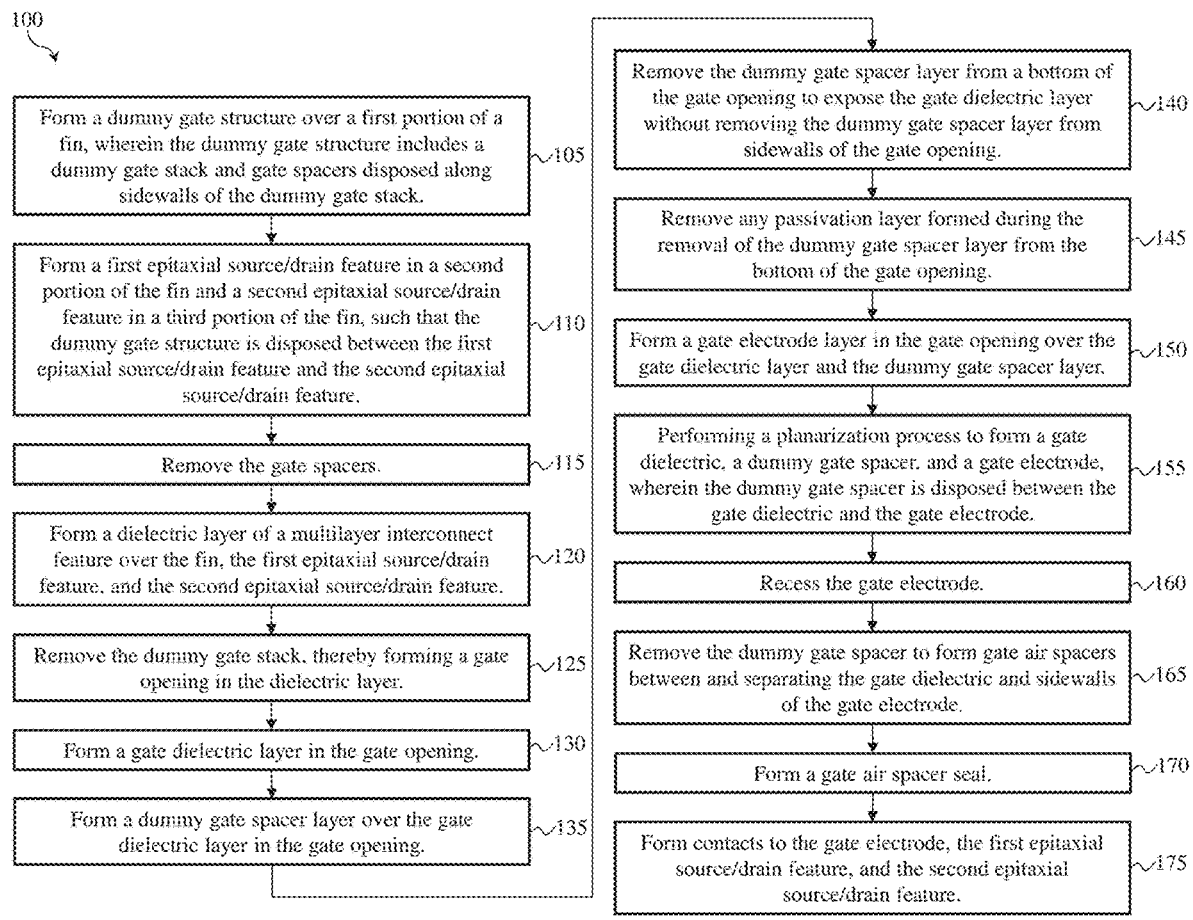
FIG. 1 is a flow chart of a method for fabricating an integrated circuit device that includes a FinFET device according to various aspects of the present disclosure.

The present disclosure relates generally to integrated circuit devices, and more particularly, to fin-like field effect transistors (FinFETs).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Resistance-capacitance (RC) delay has arisen as a significant challenge as reduced geometry sizes are implemented to achieve integrated circuits (ICs) with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. As IC technologies expand into sub-20 nm technology nodes, shrinking critical dimensions (e.g., gate lengths, gate pitches, fin pitches, via dimensions, metal line dimensions, via pitches, metal line pitches, etc.) have led to increases in parasitic capacitance, and thus increases in RC delay, that can no longer be ignored when designing scaled down ICs. For transistors, parasitic capacitance arises from gate-to-source/drain capacitance and gate-to-source/drain contact capacitance. Materials separating a gate stack of a transistor from its source/drain features (for example, gate dielectric spacers) and source/drain contacts (for example, an interlevel dielectric layer and gate dielectric spacers) can increase or decrease gate-to-source/drain capacitance and gate-to-source/drain contact capacitance, and thus increase or decrease a total parasitic capacitance of the transistor. Efforts for reducing total parasitic capacitance of the transistor are thus often directed to lowering a dielectric constant of the materials separating the gate stack from the source/drain features and/or separating the gate stack from the source/drain contacts.

The present disclosure recognizes that a high-k gate dielectric of the gate stack, which is typically implemented to improve transistor performance, also contributes to the total parasitic capacitance of the transistor, which contributions have become increasingly prevalent and detrimental in transistors at scaled technology nodes. Increasing contributions of parasitic capacitance by the high-k gate dielectric has led to degraded transistor performance. The present disclosure thus proposes integrating a gate air spacer (gap) into a gate stack of a transistor, in particular, between a gate dielectric (e.g., high-k dielectric layer) of the gate stack and sidewalls of a gate electrode of the gate stack, to reduce parasitic capacitance contributions from the gate dielectric, thereby improving AC performance and/or speed of transistors, such as fin-like field effect transistors (FinFETs). In some embodiments, the gate dielectric is completely separated from the sidewalls of the gate electrode, such that the gate dielectric does not physically contact the sidewalls of the gate electrode. For example, the gate air spacer is disposed between the gate dielectric and an entirety of the sidewalls of the gate electrode. In another example, a gate air spacer seal is disposed between the gate dielectric and a first portion of the sidewalls of the gate electrode (e.g., an upper portion) and the gate air spacer is disposed between the gate dielectric and a second portion of the sidewalls of the gate electrode (e.g., a lower portion). Such configuration eliminates gate dielectric spacers from a gate structure of the transistor, considerably lowering a dielectric constant of a space between the gate electrode and source/drain features and/or a space between the gate electrode and source/drain contacts. The lower dielectric constant reduces gate-to-source/drain capacitance and gate-to-source/drain contact capacitance (and thus total parasitic capacitance of the transistor), thereby decreasing RC delay and improved electrical performance of the transistor.

Processes for fabricating the gate air spacer into the gate stack of the transistor are easily integrated into existing gate stack fabrication processes, particularly gate replacement processes. In some embodiments, during a gate fabrication process, a dummy spacer layer (e.g., a silicon layer) is deposited over a high-k dielectric layer in a gate opening before forming a gate electrode layer over the high-k dielectric layer. The dummy spacer layer is removed from a bottom of the opening to expose the high-k dielectric layer (e.g., over a channel region of a transistor). A protection layer is formed over the dummy spacer layer along sidewalls of the opening. In some embodiments, the protection layer is formed before removing the dummy spacer layer. In some embodiments, the protection layer is formed during removing the dummy spacer layer. For example, in some embodiments, an etching process for removing the dummy spacer layer is configured to also form a protection layer (e.g., a polymer layer) over portions of the dummy spacer layer, such as those portions disposed along sidewalls of the opening. The protection layer is removed before forming the gate electrode, and the dummy spacer layer is removed after forming the gate electrode. For example, a selective etch process removes the dummy spacer layer disposed between sidewalls of the gate electrode and the high-k dielectric layer, thereby forming the gate air spacer. In some embodiments, the gate electrode is recessed (e.g., by an etch back process) before removing the dummy spacer layer. A gate air spacer seal is then formed over the gate air spacer and the gate electrode. In some embodiments, the gate air spacer seal is disposed between the high-k dielectric layer and a portion of the sidewalls of the gate electrode. The gate air spacer and the high-k dielectric layer replace an area of the transistor typically reserved for gate dielectric spacers. In some embodiments, gate dielectric spacers are implemented when forming source/drain recesses to obtain desired channel length, and then, the gate dielectric spacers are removed before performing the gate stack fabrication process.

Details of the proposed gate air spacers and methods for fabricating gate air spacers and/or configurations are described herein in the following pages and/or drawings. Though the exemplary gate air spacers are described with respect to FinFETs, the present disclosure contemplates the exemplary gate air spacers implementation in planar transistors, multi-gate transistors, gate-all-around transistors, and/or other types of transistors.

FIG. 1 is a flow chart of a method 100 for fabricating an integrated circuit device according to various aspects of the present disclosure. In the present embodiment, method 100 fabricates an integrated circuit device that includes a FinFET device. At block 105, method 100 forms a dummy gate structure over a first portion of a fin. The dummy gate structure includes a dummy gate stack and gate spacers disposed along sidewalls of the dummy gate stack. At block 110, method 100 forms a first epitaxial source/drain feature in a second portion of the fin and a second epitaxial source/drain feature in a third portion of the fin. The dummy gate structure is disposed between the first epitaxial source/drain feature and the second epitaxial source/drain feature. At block 115 and block 120, method 100 removes the gate spacers and forms a dielectric layer of a multilayer interconnect feature over the fin, the first epitaxial source/drain feature, and the second epitaxial source/drain feature. The dielectric layer is disposed along and physically contacts sidewalls of the dummy gate stack. In some embodiments, the dielectric layer includes an interlevel dielectric layer disposed over a contact etch stop layer, where the contact etch stop layer is disposed along and physically contacts sidewalls of the dummy gate stack. At block 125, method 100 removes the dummy gate stack, thereby forming a gate opening in the dielectric layer. In some embodiments, the contact etch stop layer disposed along the sidewalls of the gate stack are also removed, expanding a width of the gate opening. At block 130 and block 135, method 100 forms a gate dielectric layer in the gate opening and a dummy gate spacer layer over the gate dielectric layer in the gate opening. A material of the dummy gate spacer layer is different than a material of the gate dielectric layer to achieve etch selectivity during subsequent processing. Method 100, at block 140, proceeds with removing the dummy gate spacer layer from a bottom of the gate opening to expose the gate dielectric layer without removing the dummy gate spacer layer from sidewalls of the gate opening. In some embodiments, a selective etching process is performed to remove the dummy gate spacer layer relative to the gate dielectric layer, where the selective etching process is configured to form a passivation layer over portions of the dummy gate spacer layer that are disposed along sidewalls of the gate opening. If removing the dummy gate spacer layer forms a passivation layer, at block 145, method 100 removes the passivation layer. Method 100 then proceeds, at block 150, to form a gate electrode layer in the gate opening over the gate dielectric layer and the dummy gate spacer layer. At block 155, method 100 performs a planarization process to remove portions of the gate electrode layer, the dummy gate spacer layer, and the gate dielectric layer that do not fill the gate opening (for example, those portions disposed over a top surface of the dielectric layer of the multilayer interconnect feature). Remaining portions of the gate electrode layer, the dummy gate spacer layer, and the gate dielectric layer that fill the gate opening form a gate dielectric, a dummy gate spacer, and a gate electrode. The dummy gate spacer is disposed between the gate dielectric and the gate electrode. At block 160 and block 165, method 100 recesses the gate electrode and removes the dummy gate spacer to form gate air spacers between and separating the gate dielectric and sidewalls of the gate electrode. At block 170, method 100 forms a gate air spacer seal, such that gate air spacers are confined by the gate dielectric, the gate electrode, and the gate air spacer seal. Method 100 then proceeds, at block 175, with forming contacts to the gate electrode, the first epitaxial source/drain feature, and/or the second epitaxial source/drain feature. In some embodiments, additional fabrication steps are performed to complete fabrication of the FinFET device and/or the integrated circuit device. Additional steps can be provided before, during, and after method 100, and some of the steps described can be moved, replaced, or eliminated for additional embodiments of method 100.

FIGS. 2-19 are fragmentary cross-sectional views of a FinFET device 200, in portion or entirety, at various fabrication stages (such as those associated with method 100) according to various aspects of the present disclosure. FIG. 20 is a perspective view of FinFET device 200 at the stage of fabrication corresponding with FIG. 18 according to various aspects of the present disclosure. FIG. 18 is taken along line A-A of FIG. 20. FinFET device 200 may be included in a microprocessor, a memory, and/or other IC device. In some embodiments, FinFET device 200 may be a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2-20 have been simplified for the sake of clarity to better understand the inventive concepts of the present disclosure. Additional features can be added in FinFET device 200, and some of the features described below can be replaced, modified, or eliminated in other embodiments of FinFET device 200.

Figure 2:
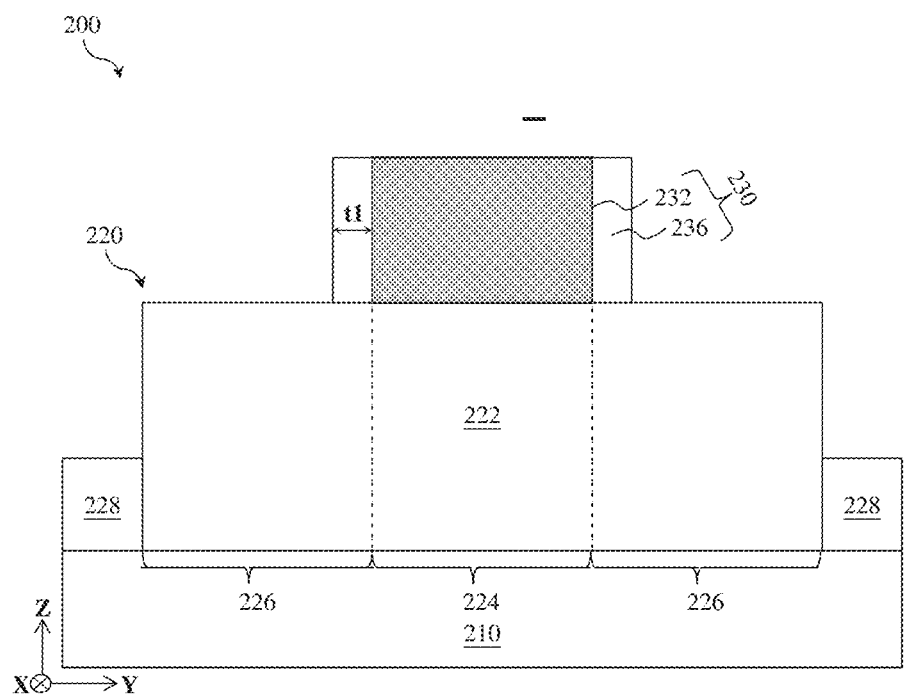
FIGS. 2-19 are fragmentary cross-sectional views of an integrated circuit that includes a FinFET device, in portion or entirety, at various fabrication stages, such as those associated with the method of FIG. 1, according to various aspects of the present disclosure.

In FIG. 2, FinFET device 200 includes a substrate (wafer) 210. In the depicted embodiment, substrate 210 includes silicon. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 210 can include various doped regions depending on design requirements of FinFET device 200. For example, substrate 210 can include a p-type doped region (referred to as a p-well), which can be configured for an n-type FinFET, and an n-type doped region (referred to as an n-well), which can be configured for a p-type FinFET. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some embodiments, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof. An ion implantation process, a diffusion process, and/or other suitable doping process can be performed to form the p-type doped regions and/or n-type doped regions of FinFET device 200.

A fin structure 220 is formed over substrate 210. In FIG. 2, fin structure 220 includes a fin 222 extending from substrate 210, where fin 222 has a width defined along an x-direction, a length defined along a y-direction, and a height defined in a z-direction. Fin 222 has a channel region 224 and source/drain regions 226 (which collectively refers to source regions and drain regions), where channel region 224 is disposed between source/drain regions 226 defined along the length (here, along the y-direction) of fin 222. In some embodiments, fin 222 is a portion of substrate 210 (such as a portion of a material layer of substrate 210). For example, in the depicted embodiment, where substrate 210 includes silicon, fin 222 includes silicon. Alternatively, fin is defined in a material layer, such as a semiconductor material layer, disposed on substrate 210. The semiconductor material may be silicon, germanium, silicon germanium, other suitable material, or combinations thereof. In some embodiments, fin 222 includes a stack of semiconductor layers disposed over substrate 210. The semiconductor layers can include same or different materials, dopants, etching rates, constituent atomic percentages, constituent weight percentages, thicknesses, and/or configurations depending on design requirements of FinFET device 200. The present disclosure contemplates embodiments where fin structure 220 includes more than one fin 222 extending from substrate 210, such that FinFET device 200 is configured as a multi-fin transistor instead of a single fin transistor.

A combination of deposition, lithography, and/or etching processes are performed to define fin 222 extending from substrate 210 as illustrated in FIG. 2. For example, forming fin 222 includes performing a lithography process to form a patterned resist layer over substrate 210 (or a material layer disposed over substrate 210) and performing an etching process to transfer a pattern defined in the patterned resist layer to substrate 210 (or the material layer disposed over substrate 210). The lithography process can include forming a resist layer on substrate 210 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of substrate 210, where the etching process uses the patterned resist layer as an etch mask. The etching process can include a dry etching process, a wet etching process, other suitable etching process, or combinations thereof. In some embodiments, a reactive ion etching (RIE) process is performed. After the etching process, the patterned resist layer is removed from substrate 210, for example, by a resist stripping process. Alternatively, fin 222 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while forming fin 222. Further, in some alternate embodiments, the exposure process can implement maskless lithography, electron-beam writing, and/or ion-beam writing for patterning.

An isolation feature(s) 228 is formed over and/or in substrate 210 to separate and isolate FinFET device 200 from other active regions of an IC device. Isolation feature 228 includes silicon oxide, silicon nitride, silicon oxynitride, other suitable isolation material (for example, including silicon, oxygen, nitrogen, carbon, or other suitable isolation constituent), or combinations thereof. Isolation feature 228 can include different structures, such as shallow trench isolation (STI) structures, deep trench isolation (DTI) structures, and/or local oxidation of silicon (LOCOS) structures. For example, isolation feature 228 can include STI features that define and electrically isolate fin 222 from other active device regions (such as fins) and/or passive device regions. STI features can be formed by etching a trench in substrate 210 (for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize top surface of isolation feature 228. In another example, STI features can be formed by depositing an insulator material over substrate 210 after forming fin 222 (in some embodiments, the insulator material layer fills gaps (trenches) between fins) and etching back the insulator material layer to form isolation feature 228. In some embodiments, STI features include a multi-layer structure that fills the trenches, such as a silicon nitride layer disposed over a thermal oxide liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer. In some embodiments, isolation feature 228 is formed by a flowable CVD (FCVD) process that includes, for example, depositing a flowable material (such as a liquid compound) over substrate 210 and converting the flowable material into a solid material by a suitable technique, such as thermal annealing and/or ultraviolet radiation treatment.

A gate structure 230 is formed over a portion of fin 222. For example, in the Y-Z plane, gate structure 230 is disposed over a top surface of the portion of fin 222, and in the X-Z plane, gate structure 230 wraps the top surface and sidewall surfaces of the portion of fin 222. Gate structure 230 extends lengthwise in a direction that is different than (e.g., orthogonal to) the lengthwise direction of fin 222. For example, gate structure 230 extends substantially parallel to the x-direction, having a width defined in the x-direction, a length defined in the y-direction, and a height defined in the z-direction. In the depicted embodiment, gate structure 230 includes a dummy gate stack 232 that includes a dummy gate electrode, and in some embodiments, a dummy gate dielectric. The dummy gate electrode includes a suitable dummy gate material, such as a polysilicon layer. Dummy gate stack 232 can thus be referred to as a poly (PO) gate stack. In the Y-Z plane, dummy gate stack 232 is disposed on a top surface of channel region 224 of fin 222 and between source/drain regions 226. In the X-Z plane, dummy gate stack 232 wraps the top surface and sidewall surfaces of channel region 224 of fin 222. In embodiments where dummy gate stack 232 includes a dummy gate dielectric disposed between the dummy gate electrode and fin 222, the dummy gate dielectric includes a dielectric material, such as silicon oxide, a high-k dielectric material, other suitable dielectric material, or combinations thereof. In some embodiments, the dummy gate dielectric includes an interfacial layer (including, for example, silicon oxide) disposed between the dummy gate dielectric and/or the dummy gate electrode and fin 222. Dummy gate stack 232 can include numerous other layers, for example, capping layers, interface layers, diffusion layers, barrier layers, hard mask layers, or combinations thereof. For example, dummy gate stack 232 can further include a hard mask layer (for example, a silicon nitride hard mask) disposed over the dummy gate electrode.

Dummy gate stack 232 is formed by deposition processes, lithography processes, etching processes, other suitable processes, or combinations thereof. For example, a deposition process is performed to form a dummy gate electrode layer over fin 222 and isolation feature 228. In some embodiments, a deposition process is performed to form a dummy gate dielectric layer over fin 222 and/or isolation feature 228 before forming the dummy gate electrode layer. In such embodiments, the dummy gate electrode layer is deposited over the dummy gate dielectric layer. In some embodiments, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), plasma enhanced ALD (PEALD), low-pressure CVD (LPCVD), atomic layer CVD (ALCVD), atmospheric pressure CVD (APCVD), other suitable methods, or combinations thereof. A lithography patterning and etching process is then performed to pattern the dummy gate electrode layer (and, in some embodiments, the dummy gate dielectric layer and/or the hard mask layer) to form dummy gate stack 232 as depicted in FIG. 2. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Gate structure 230 further includes gate spacers 236 disposed adjacent to (i.e., along sidewalls of) dummy gate stack 232. Each of gate spacers 236 have a thickness t1 along the y-direction (e.g., a gate length or a channel length direction). In some embodiments, thickness t1 is about 6.5 nm to about 8 nm. Gate spacers 236 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen (e.g., a silicon nitride layer, such as SiN, SiCN, or SiOCN) is deposited over dummy gate stack 232 (e.g., by ALD) and subsequently etched (e.g., anisotropically etched) to form gate spacers 236. In some embodiments, gate spacers 236 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent dummy gate stack 232. In such implementations, the various sets of spacers can include materials having different etch rates. For example, a first dielectric layer including silicon and oxygen (e.g., silicon oxide) can be deposited and etched to form a first spacer set adjacent to dummy gate stack 232, and a second dielectric layer including silicon and nitrogen (e.g., silicon nitride) can be deposited and etched to form a second spacer set adjacent to the first spacer set.

Figure 3:
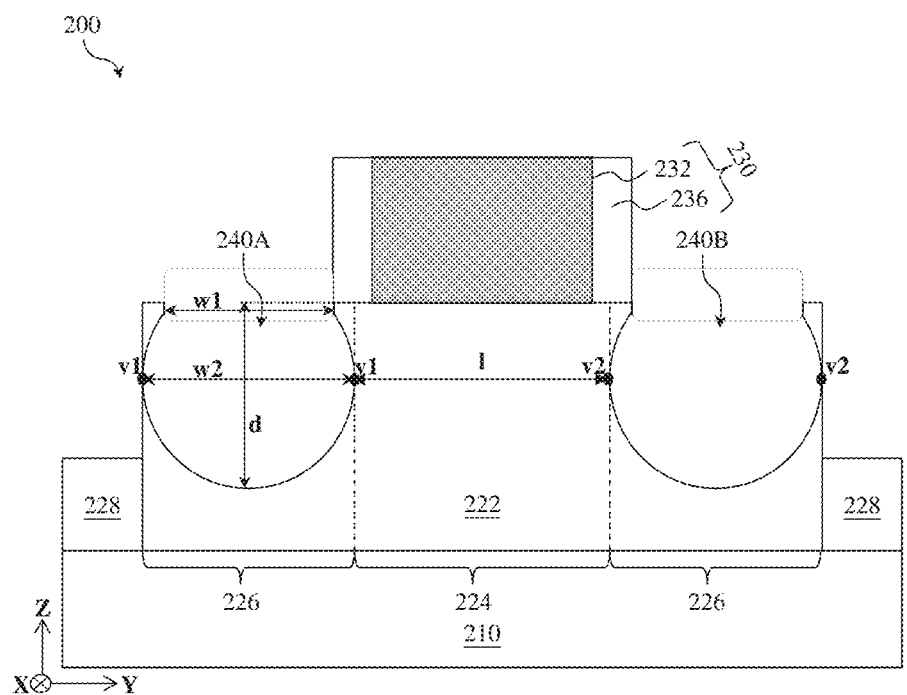

Turning to FIG. 3, a strained sourced/drain (SSD) etch is performed to form source/drain recesses (trenches), such as a source/drain recess 240A and a source/drain recess 240B. For example, exposed portions of fin 222 (i.e., source/drain regions 226 of fin 222 not covered by gate structure 230) are at least partially removed to form source/drain recesses 240A, 240B. SSD etch is controlled (tuned) to achieve a desired profile of source/drain recesses 240A, 240B and a desired channel length l of FinFET device 200. In the depicted embodiment, SSD etch is controlled to produce source/drain recesses 240A, 240B having bowl-shaped (pot-shaped) profiles in the Y-Z plane. For example, each of source/drain recesses 240A, 240B has a depth d (defined along the z-direction between a top surface of fins 222 and bottommost point of source/drain recesses 240A, 240B), a first source/drain recess portion having a width w1, and a second source/drain recess portion having a width w2, where the first source/drain recess portion is disposed over the second source/drain recess portion. Width w1 of the first source/drain recess portion is defined between substantially linear sidewalls, such that width w1 is substantially the same along depth d. Width w2 of second source/drain recess portion is defined between curved sidewalls, such that width w2 varies along depth d. A maximum width of source/drain recesses 240A is defined between source/drain tips v1, and a maximum width of source/drain recesses 240B is defined between source/drain tips v2. Such configuration results in width w2 of second source/drain portions increasing in a tapered manner along depth d from the first source/drain recess portions to source/drain tips v1, v2, respectively, and decreasing in a tapered manner along depth d from source/drain tips v1, v2, respectively to depth d. Accordingly, second source/drain recess portions form a body of the bowl-shaped profiles and first source/drain recess portions form a neck and/or a lip of the bowl-shaped profiles.

SSD etch can be tuned to achieve a tip depth and a tip proximity of source/drain tips v1, v2 that optimizes performance of FinFET device 200, such as configuring the tip depth and the tip proximity to define a channel length that minimizes parasitic resistance and/or parasitic capacitance between a subsequently formed gate structure and subsequently formed epitaxial source/drain features and/or induce a desired strain/stress in in channel region 224. Tip depth generally refers to a vertical distance between a gate stack (and/or top surface of a fin) and a portion of a source/drain feature that is closest to the gate stack (i.e., source/drain tips v1, v2), and tip proximity generally refers to a lateral distance between a sidewall of a gate stack and a portion of a source/drain feature that is closest to the sidewall of the gate stack (i.e., a distance between source/drain tips v1, v2 and the gate stack). In the depicted embodiment, source/drain recesses 240A, 240B extend under gate structure 230, in particular, under gate spacers 236, such that one of source/drain tips v1 is disposed under a respective gate spacer 236 and one of source/drain tips v2 is disposed under a respective gate spacer 236. Channel length l is defined between source/drain tips v1, v2 disposed under gate spacers 236. In the depicted embodiment, SSD etch controls a location of source/drain tips v1, v2 to define channel length l.

SSD etch selectively removes fin 222 with respect to gate structure 230 (i.e., dummy gate stack 232 and gate spacers 236) and/or isolation feature 228. In other words, SSD etch substantially removes fin 222 but does not remove, or does not substantially remove, dummy gate stack 232, gate spacers 236, and/or isolation feature 228. In the depicted embodiment, SSD removes some, but not all, of fin 222 in source/drain regions 226, such that source/drain recesses 240A, 240B are defined by fin 222. In some embodiments, SSD etch extends source/drain recesses 240A, 240B to expose substrate 210 and/or isolation feature 228, such that source/drain recesses 240A, 240B may bottoms and/or sidewalls defined by substrate 210 and/or isolation feature 228. In some embodiments, source/drain recesses 240A, 240B extend below a topmost surface of substrate 210. SSD etch can include a dry etching process, a wet etching process, other suitable etching process, or combinations thereof. In some embodiments, SSD etch is a dry etch process that implements a bromine-comprising etch gas (e.g., Br, HBr, $CH_3Br$, $CH_2Br_2$, and/or $CHBr_3$), a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), an iodine-comprising etch gas, other suitable etch gas, or combinations thereof. In some embodiments, a carrier gas is used to deliver the etch gas. The carrier gas may be an inert gas, such as an argon-comprising gas, a helium-comprising gas, a xenon-comprising gas, other suitable inert gas, or combinations thereof. Various parameters of the SSD etch are tuned to achieve a desired profile of source/drain recesses 240A, 240B and desired channel length l of FinFET device 200, such as a flow rate of an etch gas, a concentration of the etch gas, a concentration of the carrier gas, a ratio of the concentration of a first etch gas to the concentration of a second etch gas, a ratio of the concentration of the carrier gas to the concentration of the etch gas, a power of an RF source, a bias voltage, a pressure, a duration of the etch process, other suitable etch parameters, or combinations thereof. In some embodiments, SSD etch is a multi-step etch process. For example, SSD etch may implement an anisotropic source/drain etch (i.e., an etch configured to remove material in substantially one direction, such as a vertical direction (here, z-direction) with minimal (to no) removal of material in a horizontal direction (here, x-direction and/or y-direction) followed by an isotropic source/drain etch (i.e., an etch configured to remove material in multiple directions, such as the vertical direction and the horizonal direction) to achieve the depicted profile of source/drain recesses 240A, 240B. In some embodiments, the anisotropic source/drain etch is a dry etching process that implements a bromine-comprising etch gas, and the isotropic source/drain etch is a dry etching process that implements a fluorine-and-chlorine comprising etch gas. In some embodiments, a lithography process, such as those described herein, is performed to form a patterned mask layer that covers gate structure 230 and/or isolation feature 228, and the SSD etch uses the patterned mask layer as an etch mask.

Figure 4:
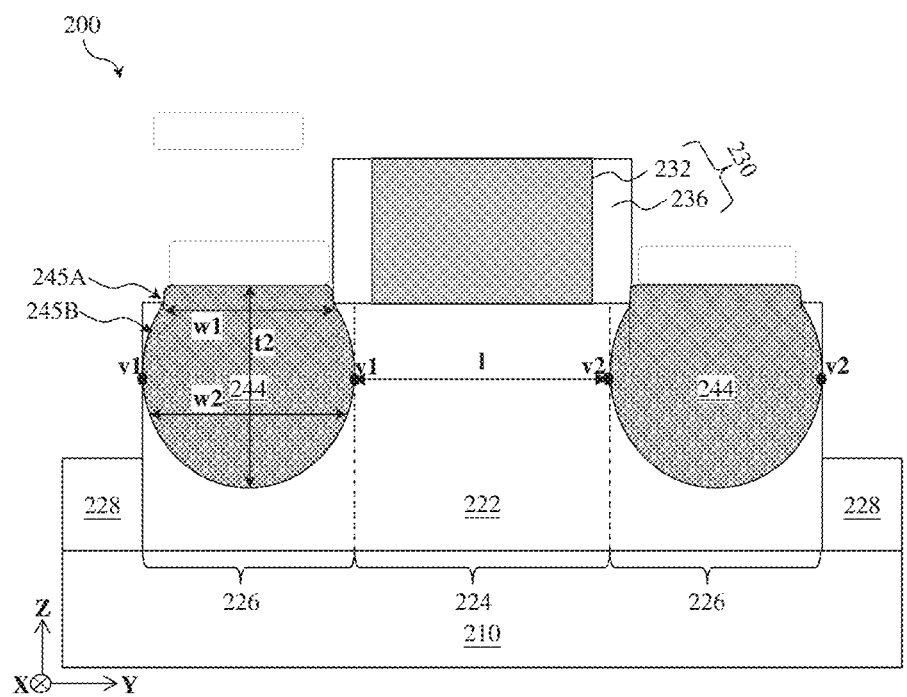

Turning to FIG. 4, epitaxial source/drain features 244 are formed in source/drain recesses 240A, 240B, such that channel length l is defined between respective source/drain tips v1, v2 of epitaxial source/drain features 244. For example, a semiconductor material is epitaxially grown from fin 222 to fill source/drain recesses 240A, 240B and form epitaxial source/drain features 244 in source/drain regions 226 of fin 222. In the depicted embodiment, the semiconductor material overfills source/drain recesses 240A, 240B, such that the semiconductor material extends over (above) the top surface of fin 222. In FIG. 4, since the semiconductor material overfills source/drain recesses 240A, 240B, epitaxial source/drain features 244 have a thickness t2 that is greater than depth d. Each of epitaxial source/drain features 240 has a first portion 245A disposed over a second portion 245B, where first portion 245A corresponds with first source/drain recess portion and second portion 245B corresponds with second source/drain recess portion. For example, epitaxial source/drain features 244 have a bowl-shaped (or pot-shaped) profile in the Y-Z plane, where each second portion 245B forms a body of the bowl-shaped profile and each first portion 245A forms a neck and/or a lip of the bowl-shaped profile. First portions 245A have width w1, and second portions 245B have width w2. First portions 245A have a thickness that is greater than a thickness of first source/drain recess portion (since top surfaces of first portions 245A are disposed above the top surface of fin 222 relative to a top surface of substrate 210), and second portions 245B have a thickness that is substantially the same as the thickness of second source/drain recess portion.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 210. Epitaxial source/drain features 244 are doped with n-type dopants and/or p-type dopants. In some embodiments, epitaxial source/drain features 244 are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain features 244 are epitaxial layers including silicon and germanium, where the silicon-germanium-compromising epitaxial layers are doped with boron, other p-type dopant, or combinations thereof. In some embodiments, epitaxial source/drain features have multi-layer structures. In some embodiments, epitaxial source/drain features 244 include materials and/or dopants that achieve desired tensile stress and/or compressive stress in channel region 224. In some embodiments, epitaxial source/drain features 244 are doped during deposition by adding impurities to a source material of the epitaxy process. In some embodiments, epitaxial source/drain features 244 are doped by an ion implantation process subsequent to a deposition process. In some embodiments, annealing processes are performed to activate dopants in epitaxial source/drain features 244 and/or other source/drain regions of FinFET device 200 (for example, HDD regions and/or LDD regions).

Turning to FIGS. 5-18, a gate replacement process is performed that replaces gate structure 230 with a gate structure 250 (see FIG. 18). Gate structure 250 has a gate dielectric (including, for example, an interfacial layer 252 and a high-k dielectric layer 254) and a gate electrode 256). The gate dielectric and gate electrode 256 can collectively be referred to as a high-k/metal gate stack, in some embodiments. As described in detail below, gate structure 250 further includes a gate air spacer 258 disposed between the gate dielectric (e.g., high-k dielectric layer 254) and gate electrode 256, which has been observed to reduce parasitic capacitance between gate electrode 256 and epitaxial source/drain features 244 and parasitic capacitance between gate electrode 256 and subsequently formed source/drain contacts to epitaxial source/drain features 244, thereby reducing a total parasitic capacitance of FinFET device 200. Such reductions in parasitic capacitance provide FinFET device 200 with operating speeds and/or alternating current (AC) performance characteristics that are faster and better than operating speeds and AC performance of FinFET devices without gate air spacer 258.

Figure 5:
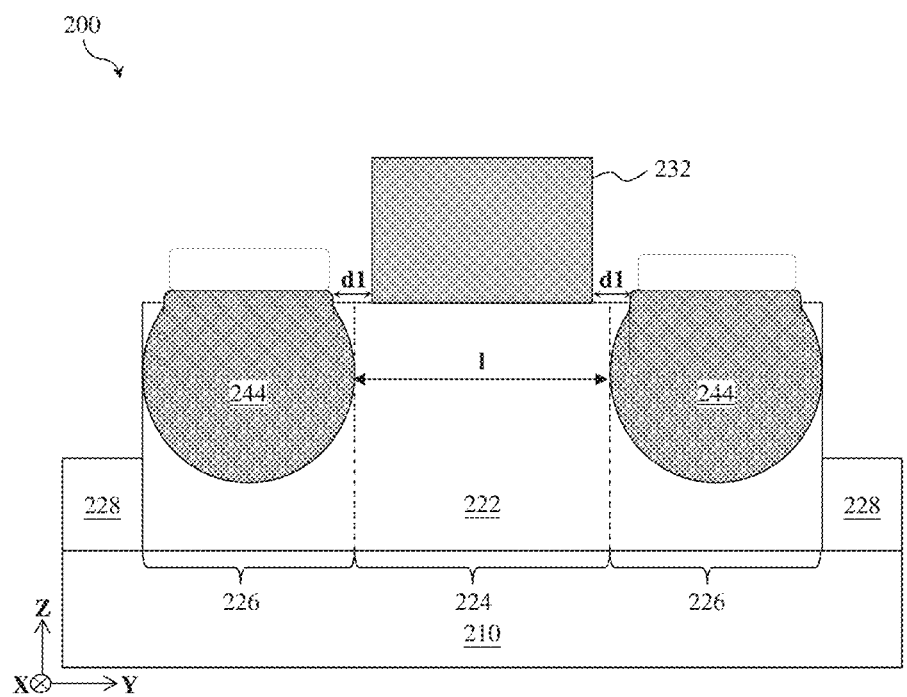
Figure 6:
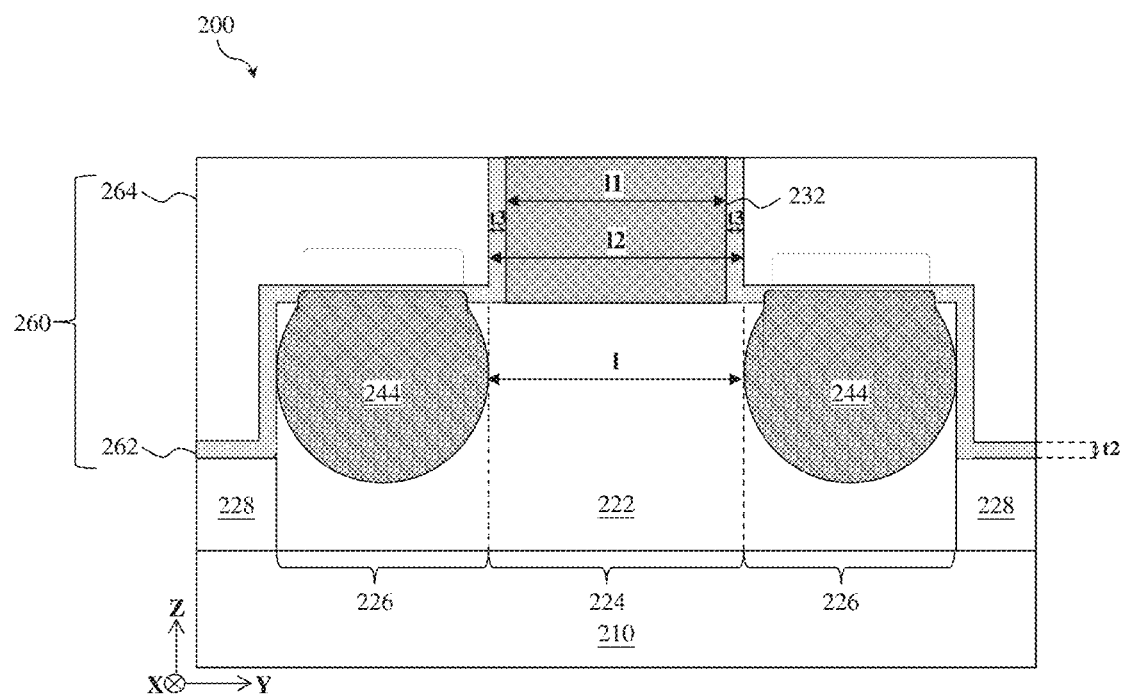

Turning to FIG. 5 and FIG. 6, gate spacers 236 are selectively removed by an etch process (FIG. 5) before forming one or more insulating layers of a multi-layer interconnect (MLI) feature 260 over substrate 210 (FIG. 6). In FIG. 5, dummy gate stack 232 is separated from a top portion of epitaxial source/drain features 244 (in particular, a portion of epitaxial source/drain features 244 disposed over a topmost surface of fin 222) by a spacing d1 after the etch process. In some embodiments, spacing d1 is substantially the same as thickness t1 of gate spacers 236 (e.g., spacing d1 is about 6.5 nm to about 8 nm, in some embodiments). In some embodiments, spacing d1 is greater than or less than thickness t1 of gate spacers 236. The etch process is configured to selectively remove gate spacers 236 with respect to dummy gate stack 232, epitaxial source/drain features 244, fin 222, and/or isolation feature 228. In other words, the etch process substantially removes gate spacers 236 but does not remove, or does not substantially remove, dummy gate stack 232, epitaxial source/drain features 244, fin 222, and/or isolation feature 228. For example, an etchant is selected for the etch process that etches the material of gate spacers 236 (e.g., silicon nitride) at a higher rate than the material of dummy gate stack 232 (e.g., polysilicon), epitaxial source/drain features 244 (e.g., silicon, germanium, or combination thereof), fin 222 (e.g., silicon), and/or isolation feature 228 (e.g., low-k dielectric material including, for example, silicon and oxygen) (i.e., the etchant has a high etch selectivity with respect to the material of gate spacers 236). The etch process is a dry etching process, a wet etching process, other suitable etching process, or combinations thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes diluted hydrofluoric acid (DHF), potassium hydroxide (KOH), ammonium hydroxide ($NH_4OH$), ammonia ($NH_3$), hydrofluoric acid (HF), nitric acid ($HNO_3$), acetic acid ($CH_3COOH$), water, other suitable wet etchant solution, or combinations thereof. In some embodiments, the etch process includes multiple steps. In some embodiments, the etch process uses a patterned mask layer as an etch mask, where the patterned mask layer covers dummy gate stack 232, epitaxial source/drain features 244, fin 222, and/or isolation feature 228 but has an opening therein that exposes gate spacers 236.

Various parameters of the etch process can be tuned to achieve selective etching of gate spacers 236, such as a flow rate of an etch gas, a concentration of the etch gas, a concentration of the carrier gas, a ratio of the concentration of a first etch gas to the concentration of a second etch gas, a ratio of the concentration of the carrier gas to the concentration of the etch gas, a power of an RF source, a bias voltage, a pressure, a duration of the etch process, other suitable etch parameters, or combinations thereof. For example, in some embodiments, a dry etching process can implement an etch gas that includes $CHF_3$ and $O_2$ to achieve selective etching of silicon nitride (e.g., gate spacers 236) with respect to polysilicon (e.g., dummy gate stack 232), silicon (e.g., fin 222), epitaxial source/drain feature 244 (e.g., silicon, germanium, or combination thereof), and/or silicon oxide (e.g., isolation feature 228). In such embodiments, a duration, a flow rate of the etch gas, a temperature, and a pressure can also be tuned to achieve desired etching of silicon nitride over polysilicon, silicon, and/or silicon oxide. In some embodiments, the duration of the dry etching process is about 50 seconds to about 120 seconds. In some embodiments, a flow rate of $CHF_3$ is about 50 sccm to about 100 sccm and a flow rate of $O_2$ is about 1 sccm to about 10 sccm. In some embodiments, the dry etching process implements a ratio of a flow rate of $CHF_3$ to a flow rate of $O_2$ of about 2 to about 4. In some embodiments, a temperature of the dry etching process is about 40° C. to about 80° C. In some embodiments, a dry etching process can implement an etch gas that includes $CHF_3$, $CH_3F$, $O_2$, and/or $SO_2$ to achieve selective etching of silicon nitride.

In FIG. 6, after removing gate spacers 236, a contact etch stop layer (CESL) 262 and an interlayer dielectric (ILD) layer 264 (ILD-0) of MLI feature 260 are formed over substrate 210. In some embodiments, ILD layer 264 (and CESL 262) form a bottommost dielectric layer of MLI feature 260. MLI feature 260 electrically couples various devices (for example, transistors, resistors, capacitors, and/or inductors) and/or components (for example, gate structures and/or source/drain features) of FinFET device 200, such that the various devices and/or components can operate as specified by design requirements of FinFET device 200. MLI feature 260 includes a combination of dielectric layers (e.g., CESL 262 and ILD layer 264) and conductive layers configured to form various interconnects. The conductive layers are configured to form vertical interconnects, such as device-level contacts and/or vias, and/or horizontal interconnects, such as conductive lines. Vertical interconnects typically connect horizontal interconnects in different layers (or different planes) of MLI feature 260 (e.g., M1 to M2). During operation, the interconnects route signals between the devices and/or the components of FinFET device 200 and/or distribute signals (for example, clock signals, voltage signals, and/or ground signals) to the devices and/or the components of FinFET device 200. It is noted that though MLI feature 260 is depicted with a given number of dielectric layers and conductive layers, the present disclosure contemplates MLI feature 260 having more or less dielectric layers and/or conductive layers depending on design requirements.

CESL 262 is formed over fin 222, isolation feature 228, dummy gate stack 232, and epitaxial source/drain features 244. ILD layer 264 is formed over CESL 262. In the depicted embodiment, because gate spacers 236 have been removed from gate structure 230, CESL 262 is disposed directly on sidewalls of dummy gate stack 232. CESL 232 has a thickness t3 along the sidewalls of dummy gate stack 232. In some embodiments, thickness t3 and a length l1 of dummy gate stack 232 along the y-direction are tuned to ensure that a sum of a total thickness of CESL 262 disposed along the sidewalls of dummy gate stack 232 (e.g., total CESL thickness=t3+t3) and length l1 of dummy gate stack 232 along the y-direction is substantially equal to channel length l. In other words, a length l2 of dummy portions of FinFET device 200 (which will be removed to form a gate opening and subsequently form gate structure 250) is substantially equal to channel length l. In some embodiments, thickness t3 is selected so that edges of sidewall portions of CESL 262 are substantially, vertically aligned with source/drain tips v1, v2 of epitaxial source/drain features 244 defining channel length l, such that a gate length of gate structure 250 is substantially the same as channel length l. In such embodiments, sidewalls of gate structure 250 (e.g., edges of high-k dielectric layer 254) will substantially, vertically align with source/drain tips v1, v2 of epitaxial source/drain features 244 that define channel length l. In some embodiments, thickness t3 of CESL 262 is about 3 nm to about 8 nm, and a thickness of ILD layer 264 is about 50 nm to about 100 nm. ILD layer 264 includes a dielectric material including, for example, silicon oxide, silicon nitride, silicon oxynitride, tetraethyl orthosilicate (TEOS) oxide, PSG, BPSG, low-k dielectric material, other suitable dielectric material, or combinations thereof. Low-k dielectric material generally refers to dielectric materials having a low dielectric constant relative to a dielectric constant of silicon dioxide (k≈3.9). For example, low-k dielectric material has a dielectric constant less than about 3.9. In some examples, low-k dielectric material has a dielectric constant less than about 2.5, which can be referred to as extreme low-k dielectric material. Exemplary low-k dielectric materials include fluorosilicate glass (FSG), carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In the depicted embodiment, ILD layer 264 includes a low-k dielectric material and is generally referred to as a low-k dielectric layer. CESL 262 includes a material different than ILD layer 264, such as a dielectric material that is different than the dielectric material of ILD layer 264. Where ILD layer 264 includes a silicon-and-oxygen comprising low-k dielectric material, CESL 262 can include silicon and nitrogen and/or carbon (for example, SiN, SiCN, SiCON, SiON, SiC, and/or SiCO) (e.g., a silicon nitride or silicon carbide layer). ILD layer 264 and/or CESL 262 can include a multilayer structure having multiple dielectric materials depending on design requirements. CESL 262 and/or ILD layer 264 are formed over substrate 210 by a deposition process, such as CVD, FCVD, HDPCVD, MOCVD, RPCVD, PECVD, LPCVD, ALCVD, APCVD, PVD, ALD, PEALD, other suitable methods, or combinations thereof. A CMP process and/or other planarization process is then performed to expose a top surface of dummy gate stack 232 and provide CESL 262, ILD layer 264, and/or dummy gate stack 232 with substantially planar top surfaces.

Figure 7:
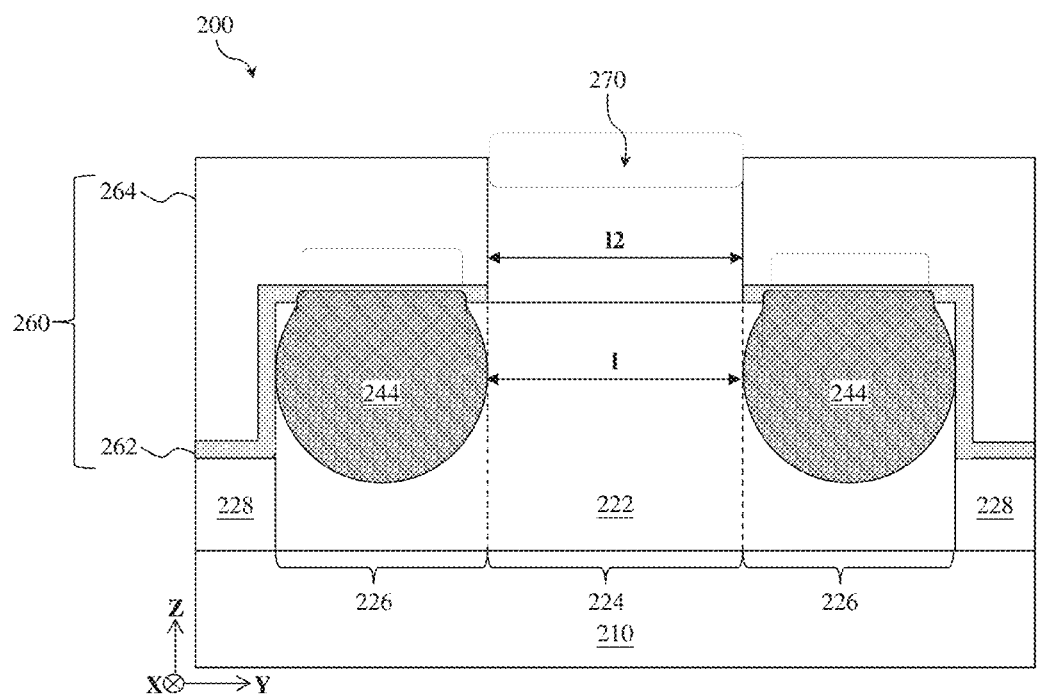

Turning to FIG. 7, an etch process removes dummy gate stack 232 to form a gate opening (trench) 270 in ILD layer 264 that exposes channel region 224 of fin 222. In the depicted embodiment, the etch process further removes portions of CESL 262 that are disposed along sidewalls of dummy gate stack 232. Gate opening 270 thus has length l2 (e.g., l1+t3+t3), which is substantially equal to channel length l. A bottom of gate opening 270 is defined by channel region 224 of fin 222, and sidewalls of gate opening 270 have upper portions defined by ILD layer 264 and lower portions defined by CESL 262. Sidewalls of gate opening 270 are substantially, vertically aligned with source/drain tips v1, v2 of epitaxial source/drain features 244 defining channel length l. In some embodiments, length l2 is greater than or less than channel length l, such that sidewalls of gate opening 270 are not substantially, vertically aligned with source/drain tips v1, v2. The etch process is configured to selectively remove dummy gate stack 232 and CESL 262 with respect to ILD layer 264. In other words, the etch process substantially removes dummy gate stack 232 and CESL 262 but does not remove, or does not substantially remove, ILD layer 264. For example, an etchant is selected for the etch process that etches the material of dummy gate stack 232 and the material of CESL 262 (e.g., polysilicon and silicon nitride, respectively) at a higher rate than the material of ILD layer 264 (e.g., low-k dielectric material including, for example, silicon and oxygen) (i.e., the etchant has a high etch selectivity with respect to the materials of dummy gate stack 232 and CESL 262). The etch process is a dry etching process, a wet etching process, other suitable etching process, or combinations thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. A wet etching process may implement a wet etchant solution that includes DHF, KOH, $NH_4OH$, $NH_3$, HF, $HNO_3$, $CH_3COOH$, $H_2O$, other suitable wet etchant solution constituents, or combinations thereof. In some embodiments, the etch process includes multiple steps. For example, in some embodiments, the etch process implements a first etchant for removing dummy gate stack 232 and a second etchant for removing CESL 262. In some embodiments, the etch process uses a patterned mask layer as an etch mask, where the patterned mask layer covers ILD layer 264 and has an opening therein that exposes dummy gate stack 232 and the portions of CESL 262 disposed along sidewalls of dummy gate stack 232.

Various parameters of the etch process can be tuned to achieve selective etching of dummy gate stack 232 and CESL 262, such as a flow rate of an etch gas, a concentration of the etch gas, a concentration of the carrier gas, a ratio of the concentration of a first etch gas to the concentration of a second etch gas, a ratio of the concentration of the carrier gas to the concentration of the etch gas, a power of an RF source, a bias voltage, a pressure, a duration of the etch process, other suitable etch parameters, or combinations thereof. For example, in the depicted embodiment, a dry etching process can implement an etch gas that includes $CF_4$ and $O_2$ to achieve selective etching of polysilicon (e.g., dummy gate stack 232) and silicon nitride (e.g., CESL 262) with respect to low-k dielectric material (e.g., ILD layer 264). In such embodiments, a duration, a flow rate of the etch gas, a temperature, and a pressure can also be tuned to achieve desired etching of polysilicon and/or silicon nitride over the low-k dielectric material. In some embodiments, the duration of the dry etching process is about 50 seconds to about 100 seconds. In some embodiments, a flow rate of $CF_4$ is about 50 sccm to about 100 sccm and a flow rate of $O_2$ is about 1 sccm to about 10 sccm. In some embodiments, the dry etching process implements a ratio of a flow rate of $CF_4$ to a flow rate of $O_2$ of about 2 to about 4. In some embodiments, the dry etching process is performed at a pressure of about 5 mTorr to about 100 mTorr. In some embodiments, a temperature of the dry etching process is about 50° C. to about 100° C. In some embodiments, the various parameters of the dry etching process are configured to achieve an etch rate of the material of dummy gate stack 232 that is substantially the same as an etch rate of the material of CESL 262, such that the dry etching process simultaneously removes dummy gate stack 232 and CESL 262. In some embodiments, the various parameters of the dry etching process are configured to achieve an etch rate of the material of dummy gate stack 232 that is different than an etch rate of the material of CESL 262, such that the dry etching process separately removes dummy gate stack 232 and CESL 262. The dry etching process can thus be configured to have more than one etching stage, for example, by changing etching gas and/or flow rates of the etching gas to achieve selective etching of different materials.

Figure 8:
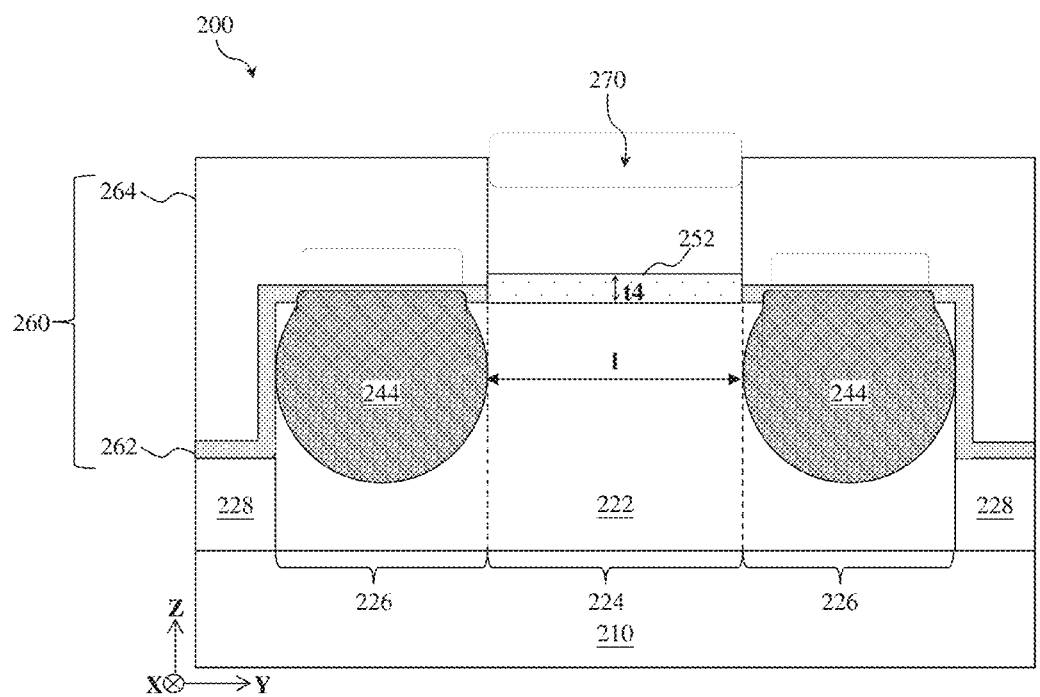
Figure 9:
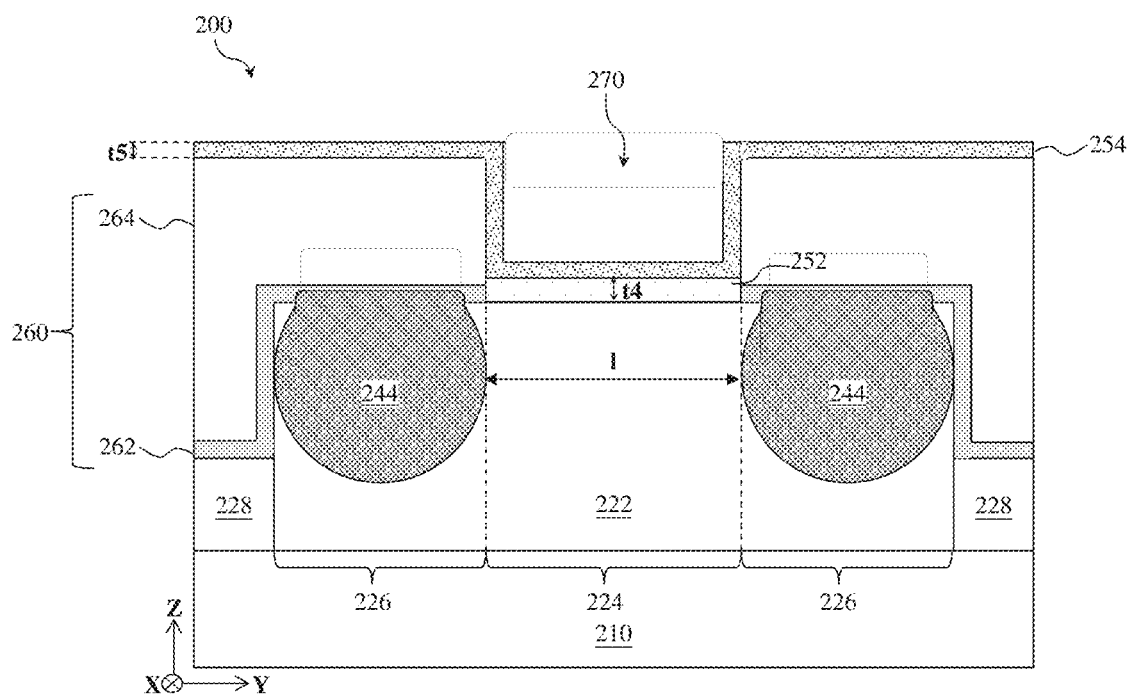

Turning to FIG. 8 and FIG. 9, the gate dielectric of gate structure 250 of FinFET device 200 is formed in gate opening 270. The gate dielectric, which includes interfacial layer 252 and high-k dielectric layer 254, partially fills gate opening 270. In the Y-Z plane (depicted in FIG. 8 and FIG. 9), the gate dielectric is disposed on the top surface of channel region 224 of fin 222 exposed by gate opening 270. In the X-Z plane, the gate dielectric wraps channel region 224 of fin 222, such that the gate dielectric is disposed on the top surface and sidewall surfaces of channel region 224 of fin 222. In FIG. 8, interfacial layer 252 having a thickness t4 is formed over channel region 224 of fin 222. Thickness t4 may be greater than, less than, or substantially the same as the thickness of CESL 262. In some embodiments, thickness t4 is about 2 nm to about 10 nm. Interfacial layer 252 includes a dielectric material, such as $SiO_2$, HfSiO, SiON, other silicon-comprising dielectric material, other suitable dielectric material, or combinations thereof. Interfacial layer 252 is formed by any of the processes described herein, such as thermal oxidation, chemical oxidation, ALD, CVD, other suitable process, or combinations thereof. In some embodiments, interfacial layer 252 is formed by a chemical oxidation process that exposes the exposed surfaces of fin 222 to hydrofluoric acid. In some embodiments, interfacial layer 252 is formed by a thermal oxidation process that exposes the exposed surfaces of fin 222 to an oxygen and/or air ambient. In some embodiments, an etch back process is performed on interfacial layer 252 to achieve a desired thickness of interfacial layer 252. In some embodiments, interfacial layer 252 is formed after forming high-k dielectric layer 254. For example, in some embodiments, after forming high-k dielectric layer 254, FinFET device 200 may be annealed in an oxygen and/or nitrogen ambient (e.g., nitrous oxide) to form interfacial layer 252 between fin 222 and high-k dielectric layer 254.

In FIG. 9, high-k dielectric layer 254 is formed over interfacial layer 252 and partially fills gate opening 270. High-k dielectric layer 254 is further formed over a top surface of ILD layer 264, bottom of gate opening 270 defined by channel region 224 of fin 222, and sidewalls of gate opening 270 defined by ILD layer 264 and/or CESL 262. High-k dielectric layer 254 is formed by any of the processes described herein, such as ALD, CVD, PVD, oxidation-based deposition process, other suitable process, or combinations thereof. For example, an ALD process deposits high-k dielectric layer 254 having a thickness t5 over FinFET device 200. In some embodiments, the ALD process is a conformal deposition process, such that thickness t5 is substantially uniform (conformal) over the various surfaces of FinFET device 200 (e.g., surfaces of ILD layer 264 and interfacial layer 262). In some embodiments, thickness t5 is about 1.5 nm to about 3 nm. Because gate spacers 236 were removed before forming ILD layer 264 and/or CESL 262, high-k dielectric layer 254 physically contacts the portions of ILD layer 264 and/or CESL 262 that define sidewalls of gate opening 270. In the depicted embodiment, interfacial layer 252 is disposed between channel region 224 of fin 222 and high-k dielectric layer 254. High-k dielectric layer 254 includes a high-k dielectric material, such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$), other suitable high-k dielectric material, or combinations thereof. High-k dielectric material generally refers to dielectric materials having a high dielectric constant, for example, greater than that of silicon dioxide ($k \approx 3.9$). For example, high-k dielectric material has a dielectric constant greater than about 3.9.

Figure 10:
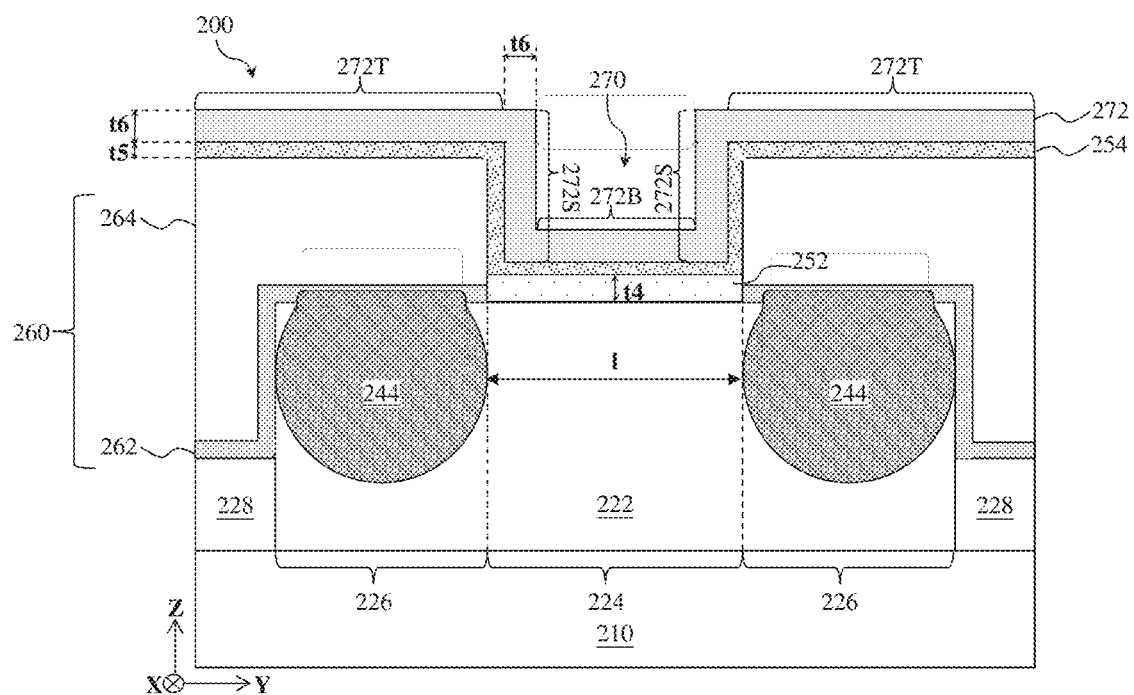

Turning to FIG. 10, a dummy (sacrificial) gate spacer layer 272 is formed over high-k dielectric layer 254 and partially fills gate opening 270. In the depicted embodiment, dummy gate spacer layer 272 has top portions 272T, sidewall portions 272S (disposed along sides of gate opening 270), and bottom portion 272B (disposed along a bottom of gate opening 270). Top portions 272T are disposed on topmost surfaces of high-k dielectric layer 254, which are disposed over the topmost surfaces of ILD layer 264. Sidewall portions 272S are disposed on top, sidewall surfaces of high-k dielectric layer 254 defining sidewalls of gate opening 270, which are disposed over sidewalls surfaces of ILD layer 264 and/or CESL 262 that defined sidewalls of gate opening 270 before deposition of high-k dielectric layer 254. Bottom portion 272B is disposed on a top surface of high-k dielectric layer defining the bottom of gate opening 270, which is disposed over a top surface of interfacial layer 252 that defined the bottom of gate opening 270 before deposition of high-k dielectric layer 254. In the depicted embodiment, bottom portion 272B is disposed over the top surface and sidewall surfaces of channel region 224 of fin 222. After deposition of dummy gate spacer layer 272, gate opening 270 is thus defined by sidewall portions 272S and bottom portion 272B, where bottom portion 272B extends between sidewall portions 272S and bottom portion 272B wraps channel region 224 of fin 222. Dummy gate spacer layer 272 is formed by any of the processes described herein, such as ALD, CVD, PVD, HDPCVD, MOCVD, RPCVD, PECVD, LPCVD, ALCVD, APCVD, spin coating, plating, other deposition process, or combinations thereof. For example, an ALD process deposits dummy gate spacer layer 272 having a thickness t6 over FinFET device 200. In some embodiments, the ALD process is a conformal deposition process, such that thickness t6 is substantially uniform over the various surfaces of FinFET device 200 (e.g., surfaces of high-k dielectric layer 254). For example, in some embodiments, thickness t6 of top portions 272A, thickness t6 of sidewall portions 272B, and thickness t6 of bottom portion 272B are the same. Thickness t6 is selected based on a desired width (thickness) of gate air spacer 258 between gate dielectric (e.g., high-k dielectric layer 254) and gate electrode 256. In some embodiments, thickness t6 is about 6.5 nm to about 8 nm. In some embodiments, thickness t6 of sidewall portions 272S is less than thickness t6 of top portions 272B. In some embodiments, thickness t6 of sidewall portions 272S is less than thickness t6 of bottom portion 272B.

A composition of dummy gate spacer layer 272 is different than compositions of other layers of gate structure 250 (in other words, the gate dielectric (e.g., high-k dielectric layer 254) and gate electrode 256) and/or ILD layer 264 to achieve etching selectivity during subsequent etching processes, such as those used to form gate air spacer 258. In other words, dummy gate spacer layer 272 and the other layers of gate structure 250 will include materials having distinct etching sensitivities to a given etchant. For example, dummy gate spacer layer 272 includes a material that is different than a high-k dielectric material to achieve etching selectivity between dummy gate spacer layer 272 and high-k dielectric layer 254 during an etching process, such that dummy gate spacer layer 272 can be selectively etched with minimal (to no) etching of high-k dielectric layer 254, and vice versa. The material of dummy gate spacer layer 272 is also different than a gate electrode material (e.g., a p-type work function material of a p-type work function layer, an n-type work function material of an n-type work function layer, a material of a metal gate bulk layer, etc., all of which may be formed as a portion of gate electrode 256) to achieve etching selectivity between dummy gate spacer layer 272 and gate electrode 256 during an etching process, such that dummy gate spacer layer 272 can be selectively etched with minimal (to no) etching of gate electrode 256, and vice versa. The material of dummy gate spacer layer 272 may also be different than a low-k dielectric material to achieve etching selectivity between dummy gate spacer layer 272 and ILD layer 264 during an etching process, such that dummy gate spacer layer 272 can be selectively etched with minimal (to no) etching of ILD layer 264, and vice versa. Dummy gate spacer layer 272 includes silicon, germanium, other suitable constituent, or combinations thereof. In the depicted embodiment, dummy gate spacer layer 272 is a silicon layer. In some embodiments, the silicon layer is doped with a suitable dopant to enhance etching selectivity. In some embodiments, dummy gate spacer layer 272 is a germanium layer or a silicon germanium layer, which in some embodiments, is doped with a suitable dopant to achieve desired etching selectivity. In some embodiments, dummy gate spacer layer 272 is an amorphous silicon layer. In some embodiments, dummy gate spacer layer 272 is a polysilicon layer. In some embodiments, dummy gate spacer layer 272 includes metal and oxygen (and can thus be referred to as a metal oxide layer), such as aluminum and oxygen (e.g., $AlO_x$). In some embodiments, dummy gate spacer layer 272 is a low-density silicon nitride layer or a low-density silicon oxide layer, for example, relative to ILD layer 264 and/or CESL 262, one or more of which may be configured as a high-density silicon nitride layer or a high-density silicon oxide layer. Degrees of density to achieve "high-density" and "low-density" can be configured to achieve desired etching selectivity for subsequent etch processes. In some embodiments, dummy gate spacer layer 272 is a BSG layer or a PSG layer. The present disclosure contemplates dummy gate spacer layer 272 including other semiconductor, dielectric, and/or metal materials that can provide the desired etching selectivity as described herein. In some embodiments, dummy spacer layer 272 includes multiple layers.

Figure 11:
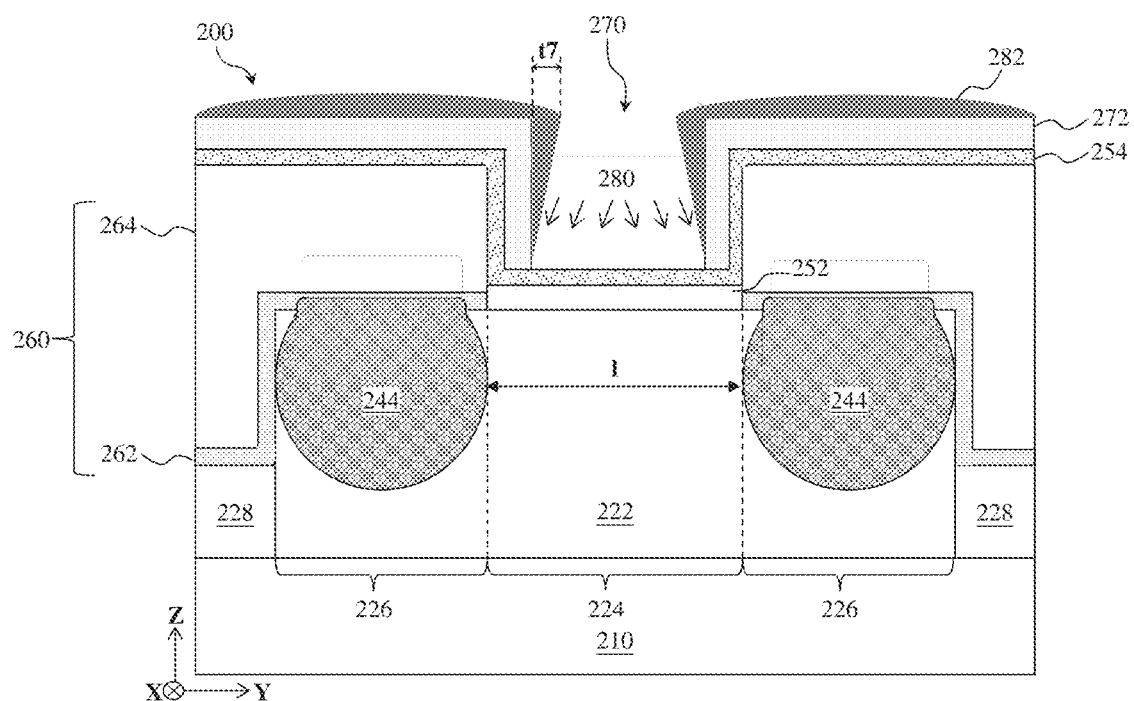
Figure 12:
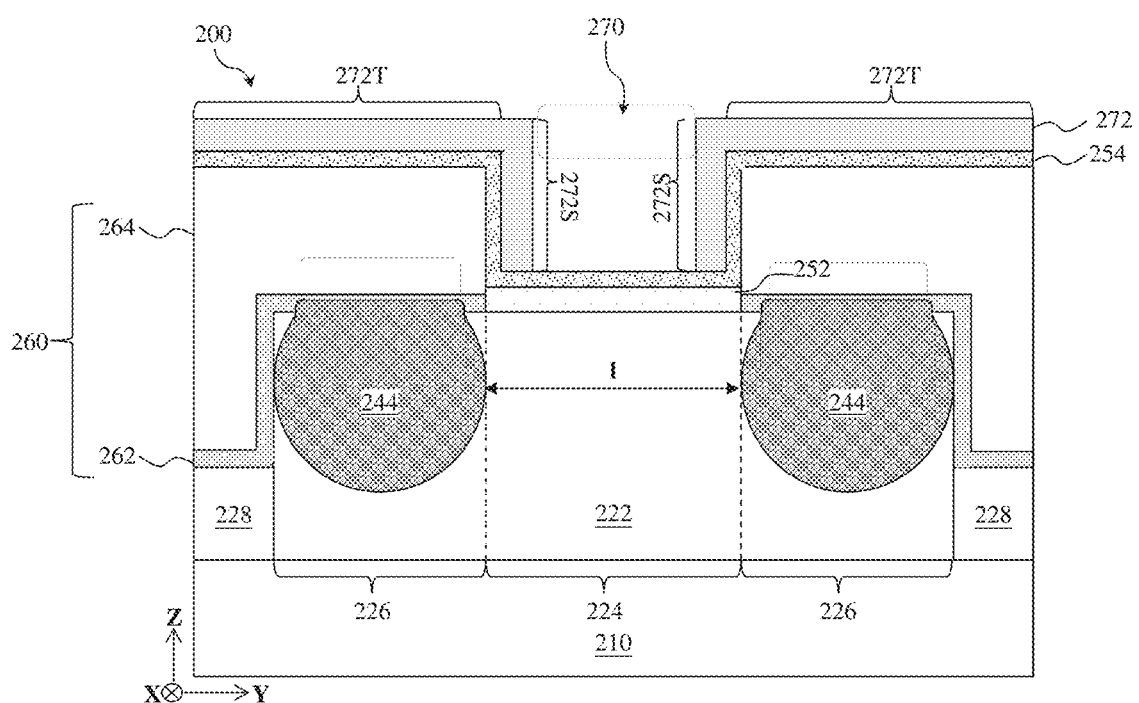

Turning to FIG. 11 and FIG. 12, dummy gate spacer layer 272 is removed from the bottom of gate opening 270 by an etch process 280 to expose a portion of high-k dielectric layer 254 disposed over channel region 224 of fin 222. For example, etch process 280 removes bottom portion 272B of dummy gate spacer layer 272 to expose high-k dielectric layer 254 in gate opening 270. Etch process 280 is configured to selectively remove dummy gate spacer layer 272 with respect to high-k dielectric layer 254. In other words, etch process 280 substantially removes dummy gate spacer layer 272 but does not remove, or does not substantially remove, high-k dielectric layer 254. For example, an etchant is selected for etch process 280 that etches the material of dummy gate spacer layer 272 (e.g., silicon) at a higher rate than the material of high-k dielectric layer 254 (e.g., high-k dielectric material) (i.e., the etchant has a high etch selectivity with respect to the material of dummy gate spacer layer 272). In the depicted embodiment, etch process 280 creates a passivation (polymer) layer 282 over sidewall portions 272S of dummy gate spacer layer 272 (i.e., those defining sidewalls of gate opening 270), preventing (or minimizing) lateral etching of dummy gate spacer layer 272. Passivation layer 280 has a thickness t7 along sidewall portions 272S. In the depicted embodiment, thickness t7 is non-uniform (i.e., varies) along sidewall portions 272S. For example, thickness t7 decreases from top to bottom of gate opening 270, such that thickness t7 at the top of gate opening 270 is greater than thickness t7 the bottom of gate opening 270. Passivation layer 282 is an etch-resistant passivation layer that protects and preserves sidewall portions 272S. Etch process 280 can thus remove bottom portion 272B of dummy gate spacer layer 272, while protecting sidewall portions 272S of dummy gate spacer layer 272, which define a location and dimension of subsequently formed gate air spacer 258. In some embodiments, passivation layer 282 is also formed over top portions 272T of dummy gate spacer layer 272, as depicted. Passivation layer 282 over top portions 272T also has a non-uniform thickness, though the present disclosure contemplates embodiments where the thickness of passivation layer 282 over top portions 272T and/or sidewall portions 272S is uniform. In some embodiments, passivation layer 282 is not formed on top portions 272T. In some embodiments, passivation layer 282 is formed on a portion of top portions 272T.

Etch process 280 is a dry etching process, a wet etching process, other suitable etching process, or combinations thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. A wet etching process may implement a wet etchant solution that includes DHF, KOH, $NH_4OH$, $NH_3$, HF, $HNO_3$, $CH_3COOH$, $H_2O$, other suitable wet etchant solution constituents, or combinations thereof. In some embodiments, the etch process includes multiple steps and/or stages. Various parameters of the etch process are tuned to achieve selective etching of bottom portion 272B of dummy gate spacer layer 272 and formation of passivation layer 282, such as a flow rate of an etch gas, a concentration of the etch gas, a concentration of the carrier gas, a ratio of the concentration of a first etch gas to the concentration of a second etch gas, a ratio of the concentration of the carrier gas to the concentration of the etch gas, a power of an RF source, a bias voltage, a pressure, a duration of the etch process, other suitable etch parameters, or combinations thereof.

In some embodiments, a duration of etch process 280 is about 50 seconds to about 100 seconds. In some embodiments, a pressure of a process chamber is about 5 mTorr to about 100 mTorr during etch process 280. In some embodiments, a power used to generate a plasma for etch process 280 is about 2 W to about 10 W. In some embodiments, the plasma is generated by an RF power source, such that the power is RF power. In some embodiments, etch process 280 is a dry etching process that uses a hydrogen-and-bromine comprising precursor, such as HBr, and an oxygen-comprising precursor, such as $O_2$, to achieve selective etching of silicon (e.g., dummy gate spacer layer 272) and formation of passivation layer 282 along sidewall portions 272S and, in some embodiments, top portions 272T. In some embodiments, the hydrogen-and-bromine comprising precursor and the oxygen-comprising precursor are used to generate a hydrogen-and-bromine-and-oxygen comprising plasma, which includes plasma-excited hydrogen, bromine, and/or oxygen comprising species. The plasma-excited hydrogen, bromine, and/or oxygen comprising species can include neutral molecules, ionized molecules, atoms, and/or ionized atoms that include hydrogen, bromine, and/or oxygen, such as $HBr^+$, $Br_2^+$, $O_2^+$, and/or $H_2O^+$. In some embodiments, hydrogen-and-bromine ions, such as $HBr^+$, travel along a direction substantially parallel to the z-direction (and thus substantially perpendicular to bottom portion 272B) into gate opening 270 and bombard bottom portion 272B, thereby knocking away and removing portions of bottom portion 272B. In some embodiments, dummy gate spacer layer 272 (here, a silicon layer) may be further etched by $SiBr_4$ volatile species generated from bombarding bottom portion 272B with the plasma-excited species, which may result from the following reactions:

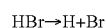

$HBr \rightarrow H + Br$

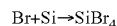

$Br + Si \rightarrow SiBr_4$.

During etch process 280, $SiBr_x$ byproducts are released into gas phase and deposit over sidewall portions 272S and top portions 272T. Plasma-excited oxygen-comprising species from the hydrogen-and-bromine-and-oxygen comprising plasma can react with sidewall portions 272S, top portions 272T, and/or $SiBr_x$ byproducts that have deposited on sidewall portions 272S and/or top portions 272T to form passivation layer 282. In such embodiments, passivation layer 272 includes silicon, oxygen, and bromine. For example, passivation layer 282 is an $SiBr_xO_y$ polymer layer, where x is a number of atoms of Br in the $SiBr_xO_y$ polymer layer, y is a number of atoms of O in the $SiBr_xO_y$ polymer layer, and x and y are greater than or equal to one. Any $SiBr_xO_y$ that is formed at the bottom of gate opening 270 may be continuously removed by the bromine ions, the hydrogen ions, and/or the $SiBr_4$ volatile species. In some embodiments, etch process 280 implements a ratio of a flow rate of HBr to a flow rate of $O_2$ of about 1:1 to about 2:1. In some embodiments, etch process 280 is a dry etching process that uses a hydrogen-and-carbon comprising precursor, such as $CH_4$, to achieve selective etching of dummy gate spacer layer 272 and formation of passivation layer 282 along sidewall portions 272S and, in some embodiments, top portions 272T. In some embodiments, the hydrogen-and-carbon comprising precursor is used to generate a hydrogen-and-carbon comprising plasma, which includes plasma-excited hydrogen and/or carbon comprising species. The plasma-excited hydrogen and/or carbon comprising species can include neutral molecules, ionized molecules, atoms, and/or ionized atoms that include hydrogen and/or carbon. In some embodiments, hydrogen and/or carbon comprising ions travel along a direction that is substantially parallel to the z-direction (and thus substantially perpendicular to bottom portion 272B) into gate opening 270 and bombard bottom portion 272B, thereby knocking away and removing portions of bottom portion 272B. In some embodiments, dummy gate spacer layer 272 is etched by volatile species generated from bombarding bottom portion 272B with the plasma-excited hydrogen and/or carbon comprising species and byproducts released into gas phase may deposit over sidewall portions 272S and top portions 272T. In some embodiments, passivation layer 282 thus includes carbon and hydrogen. For example, passivation layer 282 is a $C_jH_k$ polymer layer, where j is a number of atoms of C in the $C_jH_k$ polymer layer, k is a number of atoms of H in the $C_jH_k$ polymer layer, and j and k are greater than or equal to one. Any $C_jH_k$ that is formed at the bottom of gate opening 270 may be continuously removed by the hydrogen and/or carbon comprising ions.

Thereafter, in FIG. 12, passivation layer 282 is removed from FinFET device 200 by a clean process, thereby exposing top portions 272T and sidewall portions 272S. The clean process delivers a cleaning solution to FinFET device 200. In some embodiments, FinFET device 200 is submerged in the cleaning solution. In some embodiments, the cleaning solution is delivered, for example, by a nozzle and/or a brush to exposed surfaces of FinFET device 200. The cleaning solution can include $H_2SO_4$ (sulfuric acid), $H_2O_2$ (hydrogen peroxide), $NH_4OH$ (ammonium hydroxide), HCl (hydrochloric acid), HF (hydrofluoric acid), DHF (diluted HF), $HNO_3$ (nitric acid), $H_3PO_4$ (phosphoric acid), $H_2O$ (water) (which can be deionized water (DIW) or ozonated deionized water ($DIWO_3$)), ozone ($O_3$), other suitable chemicals, or combinations thereof. In some embodiments, the clean process implements a cleaning solution that includes a mixture of $NH_4OH$, $H_2O_2$, and $H_2O$. A ratio of a concentration of $H_2O$ to a concentration of $H_2O_2$ to a concentration of $NH_4OH$ can be about 2:2:1. In some embodiments, the clean process implements a cleaning solution that includes a mixture of HCl, $H_2O_2$, and $H_2O$. A ratio of a concentration of $H_2O$ to a concentration of $H_2O_2$ to a concentration of HCl can be about 2:1:1. In some embodiments, the clean process is a multi-step process. For example, in the depicted embodiment, the clean process is a two-step process, which includes a first clean step (referred to as a standard clean 1 (SC1)) that exposes FinFET device 200 to the mixture of $NH_4OH$, $H_2O_2$, and $H_2O$ and a second clean step (referred to as a standard clean 2 (SC2)) that exposes FinFET device 200 to the mixture of HCl, $H_2O_2$, and $H_2O$. In some embodiments, the clean process implements a clean step that exposes FinFET device to HF. In some embodiments, the clean process is as an RCA Clean, which can be implemented and/or modified as known in the art. In some embodiments, a temperature of the cleaning solution is about 50° C. to about 100° C. In some embodiments, the clean process includes performing a rinsing process and/or a drying process after exposing FinFET device 200 to the cleaning solution.

Figure 13:
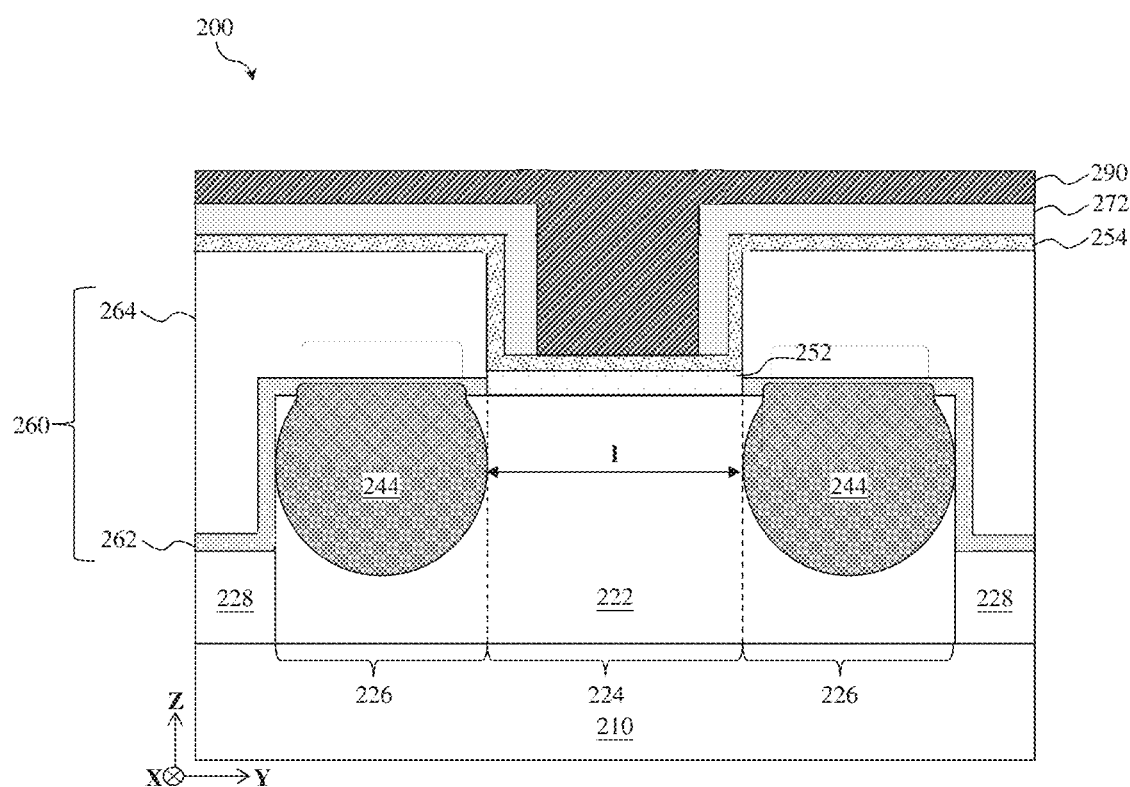

Turning to FIG. 13, a gate electrode layer 290 is formed over dummy gate spacer layer 272 and high-k dielectric layer 254 and fills a remainder of gate opening 270. After forming gate electrode layer 290, gate opening 270 is filled by interfacial layer 252, high-k dielectric layer 254, dummy gate spacer layer 272, and gate electrode layer 290, where sidewall portions 272S of dummy gate spacer layer 272 are disposed between sidewalls of gate electrode layer 290 and high-k dielectric layer 254. In the depicted embodiment, gate electrode layer 290 is disposed on top portions 272T of dummy gate spacer layer 272, sidewall portions 272S of dummy gate spacer layer, and the top surface of high-k dielectric layer 254 disposed over channel region 224 of fin 222. Gate electrode layer 290 is deposited by any of the processes described herein, such as ALD, CVD, PVD, HDPCVD, MOCVD, RPCVD, PECVD, LPCVD, ALCVD, APCVD, spin coating, plating, other deposition process, or combinations thereof. Gate electrode layer 290 includes an electrically conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, gate electrode layer 290 includes multiple layers, such as one or more capping layers, work function layers, glue/barrier layers, and/or metal fill (or bulk) layers. A capping layer can include a material that prevents and/or eliminates diffusion and/or reaction of constituents between the gate dielectric (e.g., high-k dielectric layer 254) and layers of gate electrode 256. In some implementations, the capping layer includes a metal and nitrogen, such as TiN, TaN, $W_2N$, TiSiN, TaSiN, or combinations thereof. A work function layer includes a conductive material tuned to have a desired work function (such as an n-type work function or a p-type work function), such as n-type work function materials and/or p-type work function materials. A p-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. An n-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, Co, Ru, and/or Cu.

Figure 14:
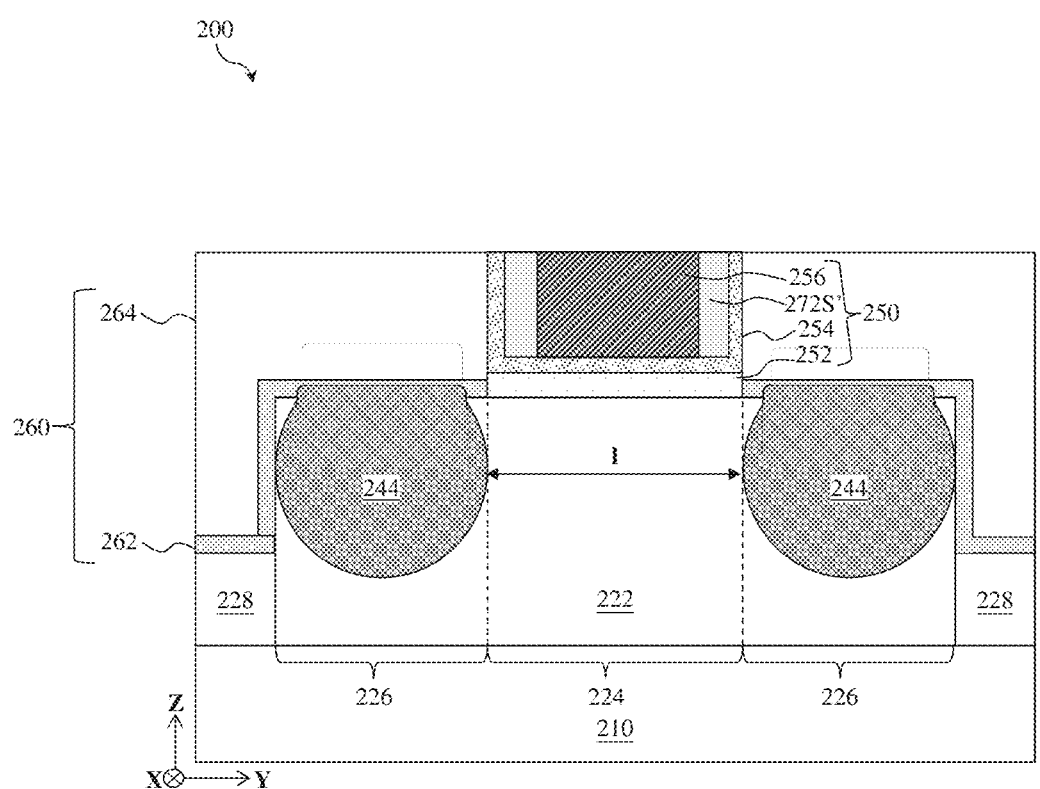

Turning to FIG. 14, a planarization process is performed to remove excess gate materials from FinFET device 200. For example, a CMP process is performed until a top surface of ILD layer 264 is reached (exposed), such that a top surface of gate structure 250 and the top surface of the ILD layer 264 are substantially planar. In the depicted embodiment, after the CMP process, gate structure 250 includes interfacial layer 252, high-k dielectric layer 254, and gate electrode 256, which is formed from a remaining portion of gate electrode layer 290. The CMP process removes portions of gate electrode layer 290 and high-k dielectric layer 254 disposed over the top surface of ILD layer 264. The CMP process also removes top portions 272T and any portion of sidewall portions 272S of dummy gate spacer layer 272 that extends beyond (above) the top surface of ILD layer 264. Accordingly, a remainder of sidewall portions 272S of dummy gate spacer layer 272 form a dummy gate spacer 272S' of gate structure 250, which is disposed between high-k dielectric layer 254 and sidewalls of gate electrode 256.

Figure 15:
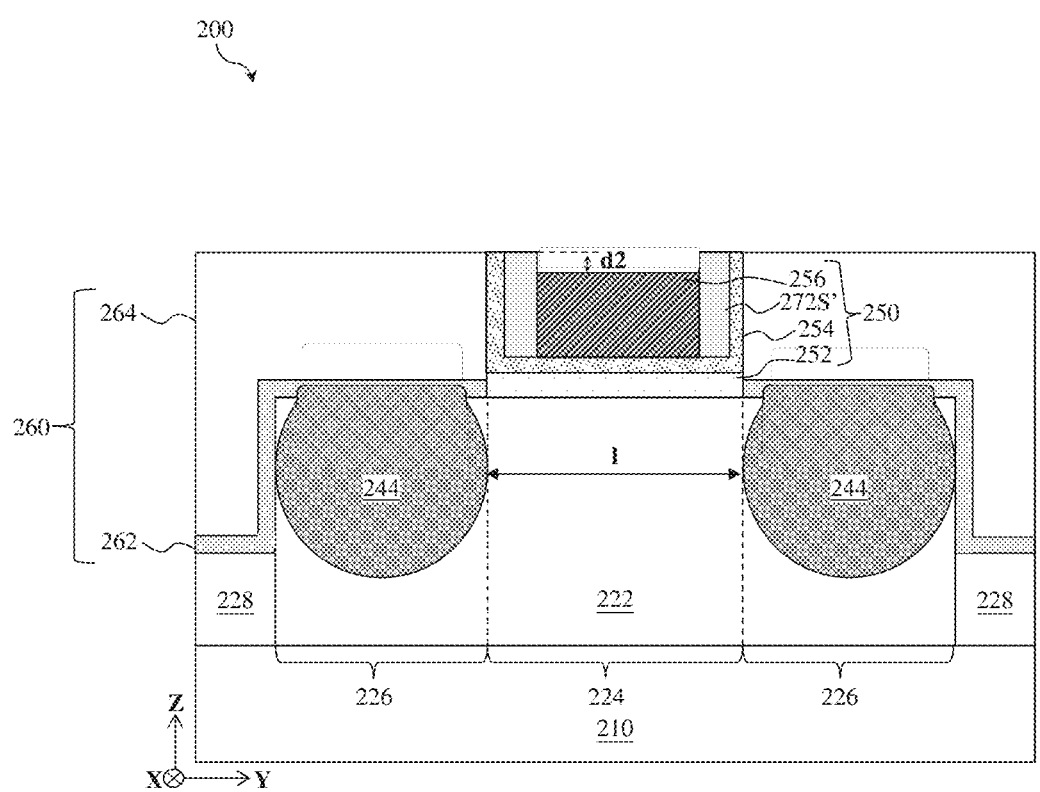

Turning to FIG. 15, an etch back process is performed on gate electrode 256, such that a top surface of gate electrode 256 is lower than top surfaces of dummy gate spacer 272S' relative to a top surface of fin 222. For example, a distance d2 along the z-direction between the top surface of gate electrode 256 and top surfaces of dummy gate spacer 272S' is about 5 nm to about 5 nm. The etch back process is configured to selectively remove gate electrode 256 with respect to dummy gate spacer 272S', ILD layer 264, and high-k dielectric layer 254. In other words, the etch back process substantially removes gate electrode 256 but does not remove, or does not substantially remove, dummy gate spacer 272S', ILD layer 264, and high-k dielectric layer 254. For example, an etchant is selected for the etch process that etches the materials of gate electrode 256 (e.g., metal) at a higher rate than the materials of dummy gate spacer 272S', ILD layer 264, and high-k dielectric layer 254 (e.g., semiconductor materials and dielectric materials including, for example, silicon and oxygen) (i.e., the etchant has a high etch selectivity with respect to the materials of gate electrode 256). The etch back process is a dry etching process, a wet etching process, other suitable etching process, or combinations thereof. In the depicted embodiment, the etch back process is a wet etching process that implements a wet etchant solution that removes a metal material without substantially removing a silicon material, a high-k dielectric material, and a low-k dielectric material. For example, the wet etchant solution includes a mixture of $NH_4OH$, $H_2O_2$, and $H_2O$. A ratio of a concentration of $H_2O$ to a concentration of $H_2O_2$ to a concentration of $NH_4OH$ can be about 2:2:1. In some embodiments, the wet etchant solution includes DHF, KOH, $NH_4OH$, $H_2O_2$, $NH_3$, HF, $HNO_3$, $H_2SO_4$, $H_3PO_4$, HCl, $CH_3COOH$, $H_2O$ (which can be DIW or $DIWO_3$), $O_3$, other suitable wet etchant solution constituents, or combinations thereof. In some embodiments, the etch back process is a dry etching process that implements a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. In some embodiments, the etch process includes multiple steps. In some embodiments, the etch process uses a patterned mask layer as an etch mask, where the patterned mask layer covers dummy gate spacer 272S', ILD layer 264, and high-k dielectric layer 254 and has an opening therein that exposes gate electrode 256.

Figure 16:
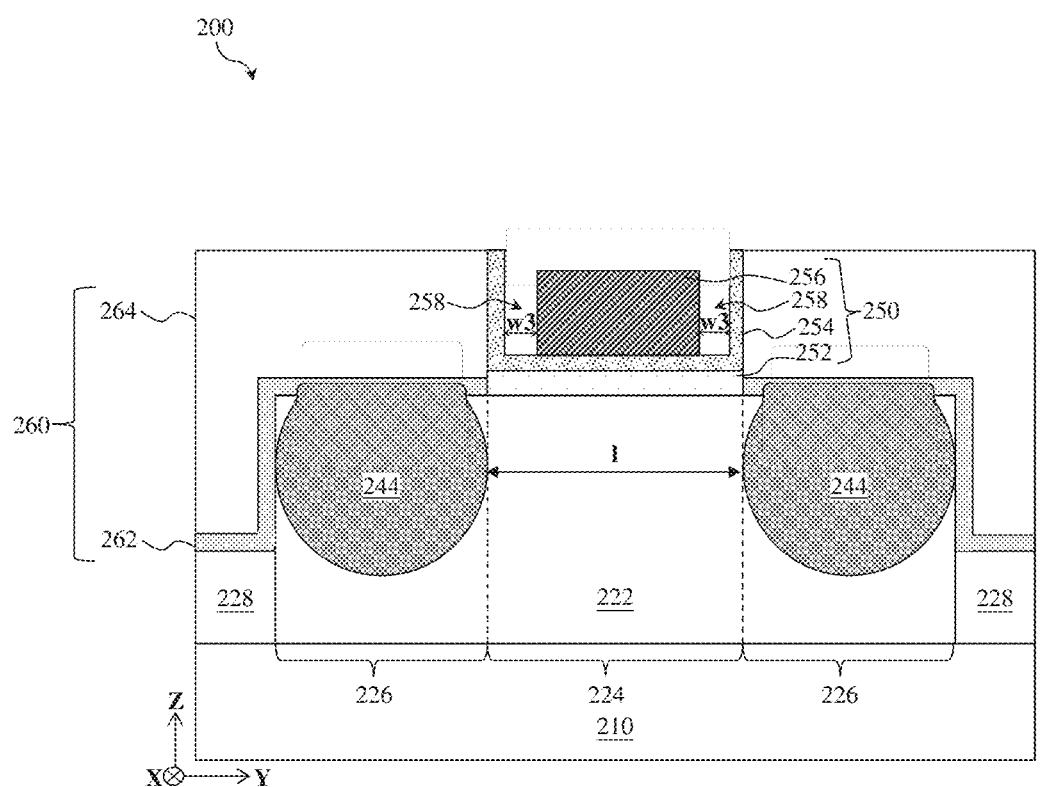

Turning to FIG. 16, dummy gate spacer 272S' is selectively removed from gate structure 250 by an etch process to form gate air spacer 258. Gate air spacer 258 is defined between and separates high-k dielectric layer 254 and sidewalls of gate electrode 256. In the depicted embodiment, gate air spacer 258 has a u-shaped profile and wraps gate electrode 256, such that gate air spacer 258 physically contacts a top and sidewalls of gate electrode 256. For example, gate air spacer 258 has a first sidewall portion and a second sidewall defined between respective sidewalls of high-k dielectric layer 254 and sidewalls of gate electrode 256 and a top portion that extends between the first sidewall portion and the second sidewall portion, where the top portion is defined between sidewalls of high-k dielectric layer 254. The first sidewall portion and the second sidewall portion each have a bottom defined by high-k dielectric layer 254, whereas the top portion has a bottom defined by gate electrode 256. Each of the first sidewall portion and the second sidewall portion has a width w3 defined along the y-direction between high-k dielectric layer 254 and gate electrode 256. In the depicted embodiment, width w3 is substantially equal to thickness t6 of dummy gate spacer 272S'. For example, width w3 is about 6.5 nm to about 8 nm. In some embodiments, width w3 is greater than thickness t6, for example, where etching of dummy gate spacer 272S' partially etches high-k dielectric layer 254 and/or gate electrode 256. In some embodiments, width w3 is less than thickness t6, for example, where etching of bottom portion 272B of dummy gate spacer layer 272 partially etches sidewall portions 272B of dummy gate spacer layer 272. In such embodiments, width w3 may be tapered, for example, decreasing from top to bottom of gate structure 250.

The etch process is configured to selectively remove dummy gate spacer 272S' with respect to high-k dielectric layer 254, gate electrode 256, and ILD layer 264. In other words, the etch process substantially removes dummy gate spacer 272S' but does not remove, or does not substantially remove, high-k dielectric layer 254, gate electrode 256, and ILD layer 264. For example, an etchant is selected for the etch process that etches the material of dummy gate spacer 272S' (e.g., silicon) at a higher rate than the material of high-k dielectric layer 254 (e.g., high-k dielectric material), gate electrode 256 (e.g., various metal materials), and ILD layer 264 (e.g., low-k dielectric material) (i.e., the etchant has a high etch selectivity with respect to the material of dummy gate spacer 272S'). The etch process is a dry etching process, a wet etching process, other suitable etching process, or combinations thereof. The dry etching process may implement a hydrogen-comprising etch gas (e.g., $H_2$ and/or $CH_4$), a nitrogen-comprising etch gas (for example, $N_2$ and/or $NH_3$), a chlorine-comprising etch gas (for example, $Cl_2$, $CHCl_3$, $CCl_4$, and/or $BCl_3$), an oxygen-comprising etch gas (for example, $O_2$), a fluorine-comprising etch gas (for example, $F_2$, $CH_3F$, $CH_2F_2$, $CHF_3$, $CF_4$, $C_2F_6$, $SF_6$, and/or $NF_3$), a bromine-comprising etch gas (e.g., Br, HBr, $CH_3Br$, $CH_2Br_2$, and/or $CHBr_3$), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. A wet etching process may implement a wet etchant solution that includes DHF, KOH, $NH_4OH$, $NH_3$, HF, $HNO_3$, $CH_3COOH$, $H_2O$, other suitable wet etchant solution constituents, or combinations thereof. In some embodiments, the etch process includes multiple steps and/or stages. Various parameters of the etch process are tuned to achieve selective etching of dummy gate spacer 272S', such as a flow rate of an etch gas, a concentration of the etch gas, a concentration of the carrier gas, a ratio of the concentration of a first etch gas to the concentration of a second etch gas, a ratio of the concentration of the carrier gas to the concentration of the etch gas, a power of an RF source, a bias voltage, a pressure, a duration of the etch process, other suitable etch parameters, or combinations thereof. In some embodiments, etch process is a dry etching process that uses a hydrogen-and-bromine comprising precursor, such as HBr, and an oxygen-comprising precursor, such as $O_2$. In some embodiments, the hydrogen-and-bromine comprising precursor and the oxygen-comprising precursor are used to generate a hydrogen-and-bromine-and-oxygen comprising plasma, which includes plasma-excited hydrogen, bromine, and/or oxygen comprising species. In some embodiments, the dry etching process does not incorporate the oxygen-comprising precursor and may generate a hydrogen-and-bromine comprising plasma. In some embodiments, the etch process is a dry etching process that uses a hydrogen-and-carbon comprising precursor, such as $CH_4$. In some embodiments, the hydrogen-and-carbon comprising precursor is used to generate a hydrogen-and-carbon comprising plasma. In some embodiments, a duration of the etch process is about 50 seconds to about 100 seconds. In some embodiments, a pressure of a process chamber is about 5 mTorr to about 100 mTorr during the etch process. In some embodiments, a power used to generate a plasma for the etch process is about 2 W to about 10 W. In some embodiments, the plasma is generated by an RF power source, such that the power is RF power. In some embodiments, the etch process is similar to the etch process used to etch bottom portions 272B of dummy gate spacer layer 272, as described above with reference to FIG. 11. In such embodiments, the etch process may or may not form a passivation layer on ILD layer 264.

Figure 17:
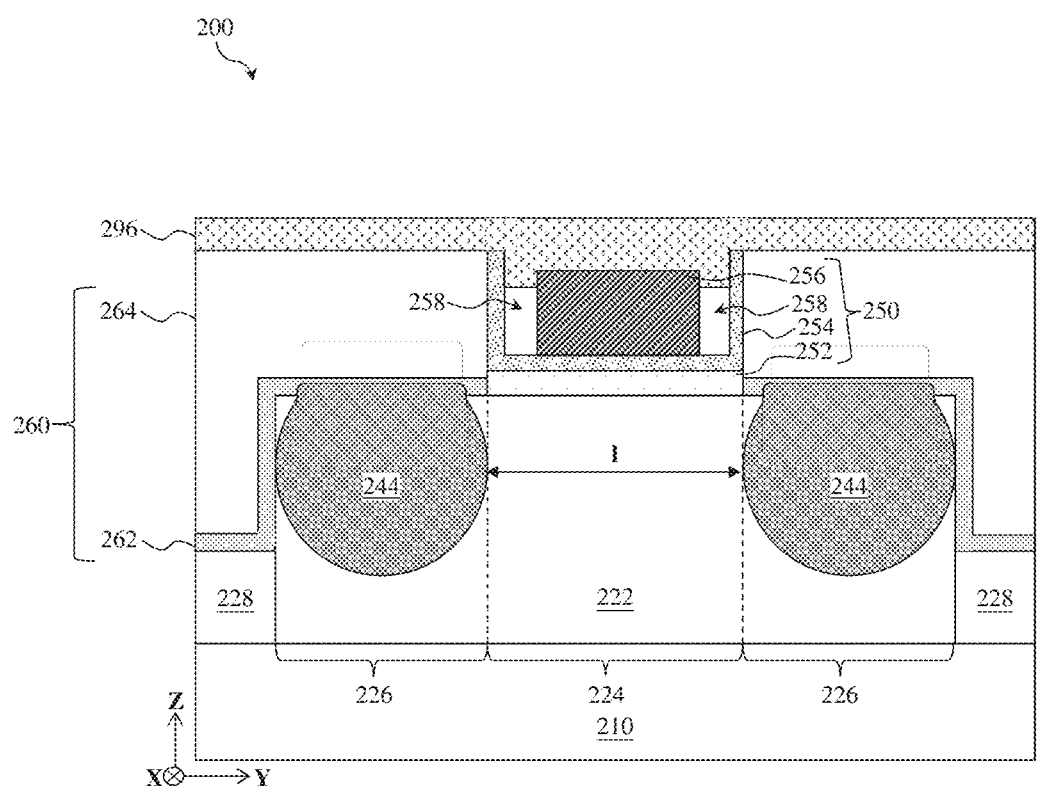
Figure 18:
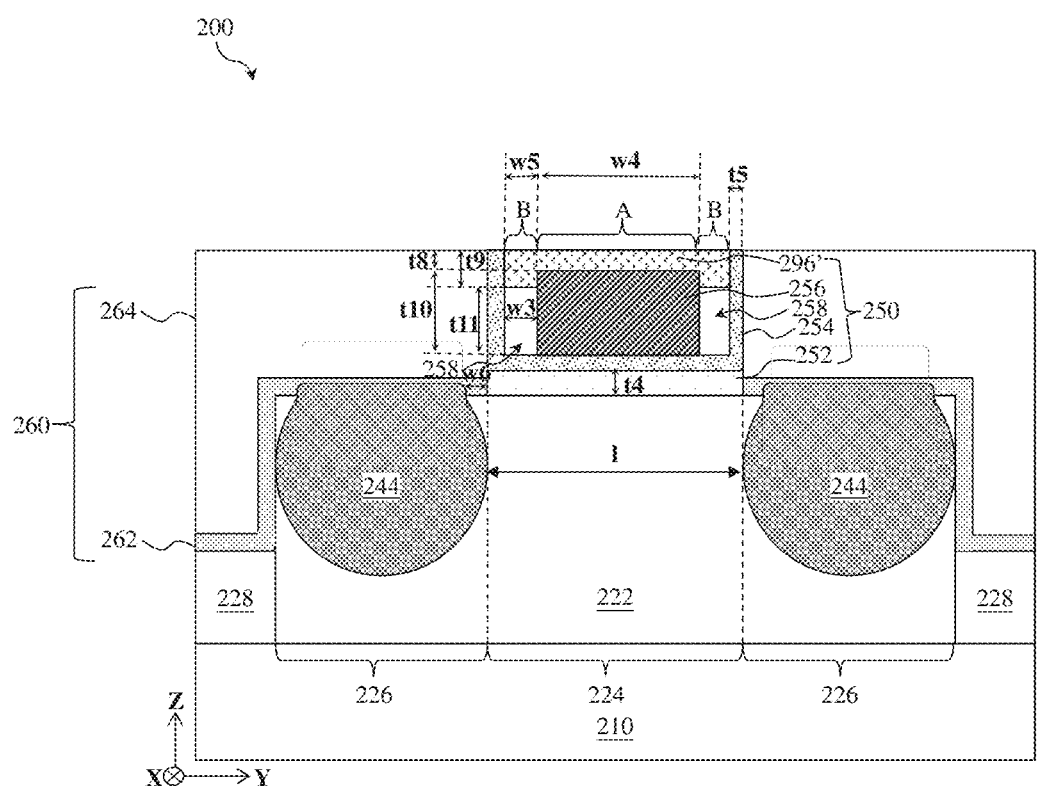

Turning to FIG. 17, FIG. 18 and FIG. 20 (which is a perspective view of FinFET device 200 at the stage of fabrication corresponding with FIG. 18), processing continues with forming a gate air spacer seal 296' that seals (closes) gate air spacer 258. Gate air spacer seal 296' fills a topmost portion of gate air spacer 258, such that materials formed over gate structure 250 during subsequent processing (for example, materials from insulating layers and/or conductive layers of MLI feature 260) do not seep or enter into gate air spacer 258 and degrade or alter the reduced capacitance and/or resistance characteristics of FinFET device 200 provided by gate air spacer 258. In FIG. 17, a gate air spacer seal layer 296 is deposited over FinFET device 200 by any of the processes described herein, such as ALD, CVD, PVD, HDPCVD, MOCVD, RPCVD, PECVD, LPCVD, ALCVD, APCVD, spin coating, plating, other deposition process, or combinations thereof. In the depicted embodiment, gate air spacer seal layer 296 seeps into and fills a portion of gate air spacer 258 between high-k dielectric layer 254 and sidewalls of gate electrode 256. In some embodiments, width w3 of gate air spacer 258 is designed to prevent gate air spacer seal layer 296 from seeping into any portion of gate air spacer 258 between high-k dielectric layer 254 and sidewalls of gate electrode 256 (i.e., width w3 is small enough). Gate air spacer seal layer 296 includes any suitable material. In the depicted embodiment, gate air spacer seal layer 296 includes a dielectric material that includes silicon and nitrogen, such as silicon nitride (and thus can be referred to as a silicon nitride layer). In some embodiments, gate air spacer seal layer 296 includes carbon, such as a silicon carbonitride layer. In some embodiments, gate air spacer seal layer 296 includes amorphous silicon (a-Si), which generally refers to silicon in non-crystalline form (i.e., having a disordered atomic structure).

In FIG. 18, a planarization process is performed to remove excess gate air spacer seal layer 296 from FinFET device 200, such as portions of gate air spacer seal layer 296 disposed over the top surface of ILD layer 264, thereby forming gate air spacer seal 296'. For example, a CMP process is performed until a top surface of ILD layer 264 is reached (exposed), such that a top surface of gate air spacer seal 296' (and, thus, a top surface of gate structure 250) is substantially planar with the top surface of ILD layer 264. Because gate spacer seal layer 296 seeps into and fills a portion of gate air spacer 258 between high-k dielectric layer 254 and sidewalls of gate electrode 256, gate air spacer seal 296' has an A portion that extends between B portions, where A portion extends over and physically contacts the top surface of gate electrode 256 and each B portion is disposed between a respective upper portion of high-k dielectric layer 254 and A portion and between a respective upper portion of high-k dielectric layer 254 and gate electrode 256. A width of A portion along the y-direction is substantially the same as a width of gate electrode 256 along the y-direction, both of which are designated by a width w4. Each B portion has a width w5, which is substantially equal to width w3. In some embodiments, width w4 is about 20 nm to about 50 nm, and width w5 is about 6.5 nm to about 8 nm. In some embodiments, width w5 is greater than or less than width w3. A thickness t8 of A portion along the z-direction is less than a thickness t9 of B portions along the z-direction. In some embodiments, thickness t8 is substantially equal to distance d2. In some embodiments, thickness t8 is about 5 nm to about 10 nm, and thickness t9 is about 8 nm to about 15 nm. In some embodiments, thickness t9 is substantially equal to thickness t8, for example, where gate spacer seal layer 296 does not seep into and fill the portion of gate air spacer 258 between high-k dielectric layer 254 and sidewalls of gate electrode 256. In such embodiments, portions B are not disposed between a respective upper portion of high-k dielectric layer 254 and gate electrode 256, and gate air spacer 258 is disposed along an entirety of sidewalls of gate electrode 256.

In FIG. 18 and FIG. 20, gate structure 250 thus includes gate dielectric (e.g., interfacial layer 252 and high-k dielectric layer 254), gate electrode 256, gate air spacer 258, and gate air spacer seal 296'. Gate air spacer 258 is enclosed by high-k dielectric layer 254, gate electrode 256, and gate air spacer seal 296'. In the depicted embodiment, gate air spacer 258 and gate air spacer seal 296' are both disposed between and separate high-k dielectric layer 254 and sidewalls of gate electrode 256. Gate air spacer 258 separates a lower portion of high-k dielectric layer 254 from sidewalls of gate electrode 256, and gate air spacer seal 296' separates an upper portion of high-k dielectric layer 254 from sidewalls of gate electrode 256. Gate air spacer 258 also wraps channel region 224 of fin 222. Gate electrode 256 has a thickness t10 along the z-direction, and gate air spacer 258 has a thickness t11 along the z-direction. In the depicted embodiment, because gate air spacer seal 296' separates the upper portion of high-k dielectric layer 254 from sidewalls of gate electrode 256, thickness t11 is less than thickness t10. In some embodiments, thickness t10 is about 20 nm to about 30 nm, and thickness t11 is about 15 nm to about 20 nm. In embodiments where gate air spacer seal 296' does not separate the upper portion of high-k dielectric layer 254 from sidewalls of gate electrode 256, thickness t11 is substantially equal to thickness t10. It is further noted that, in the depicted embodiment, a gate length of gate structure 250 (i.e., gate length=(thickness t5×2)+(width w5×2)+w4) is substantially equal to channel length l. Edges of gate structure 250 defined by high-k dielectric layer 254 and interfacial layer 252 are thus substantially, vertically aligned with respective source/drain tips v1, v2 of epitaxial source/drain features 244. Further, because gate spacers 236 were removed before forming a dielectric layer of MLI feature 260 (here, ILD layer 264 and CESL 262), the dielectric layer is disposed between and physically contacts sidewalls of epitaxial source/drain features 244 and sidewalls of the gate dielectric (here, interfacial layer 252 and high-k dielectric layer 254) of gate structure 250. In some embodiments, the dielectric layer of MLI feature 260 has a width w6 between epitaxial source/drain feature 244 and the gate dielectric of gate structure 250. In the depicted embodiment, because sidewall portions of CESL 262 are removed when forming gate opening 270, width w6 is less than spacing d1. In some embodiments, width w6 is about 5 nm to about 8 nm. In embodiments where sidewall portions of CESL 262 are not removed, width w6 is substantially equal to spacing d1.

Figure 19:
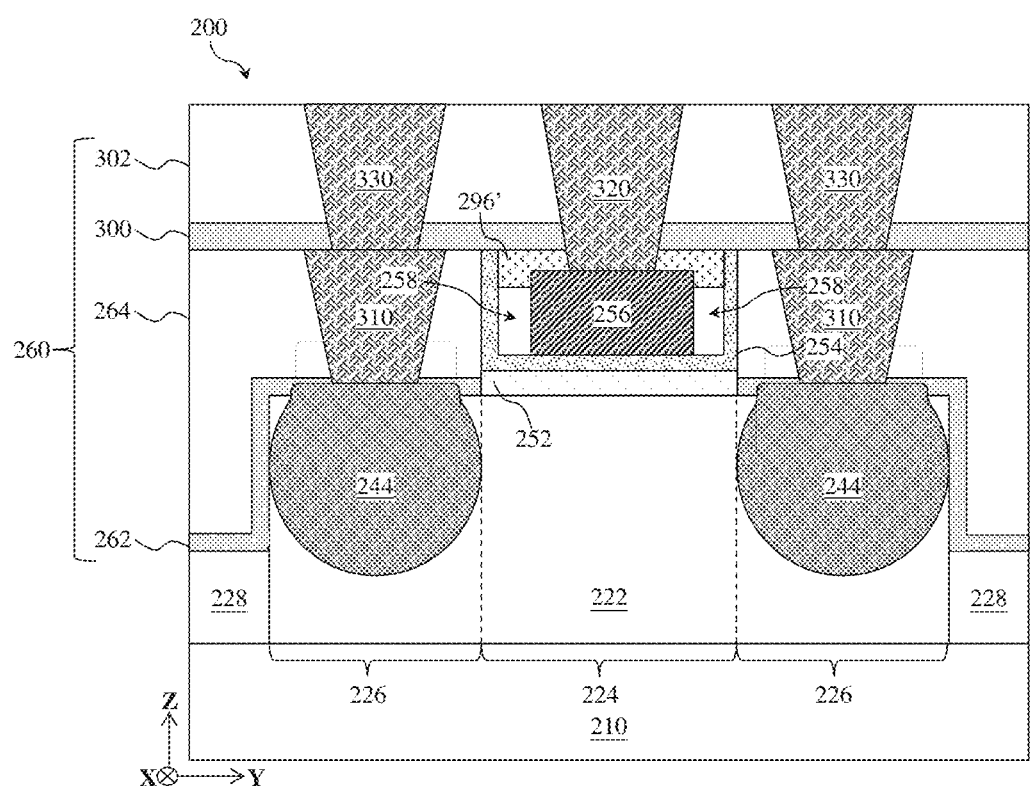
Figure 20:
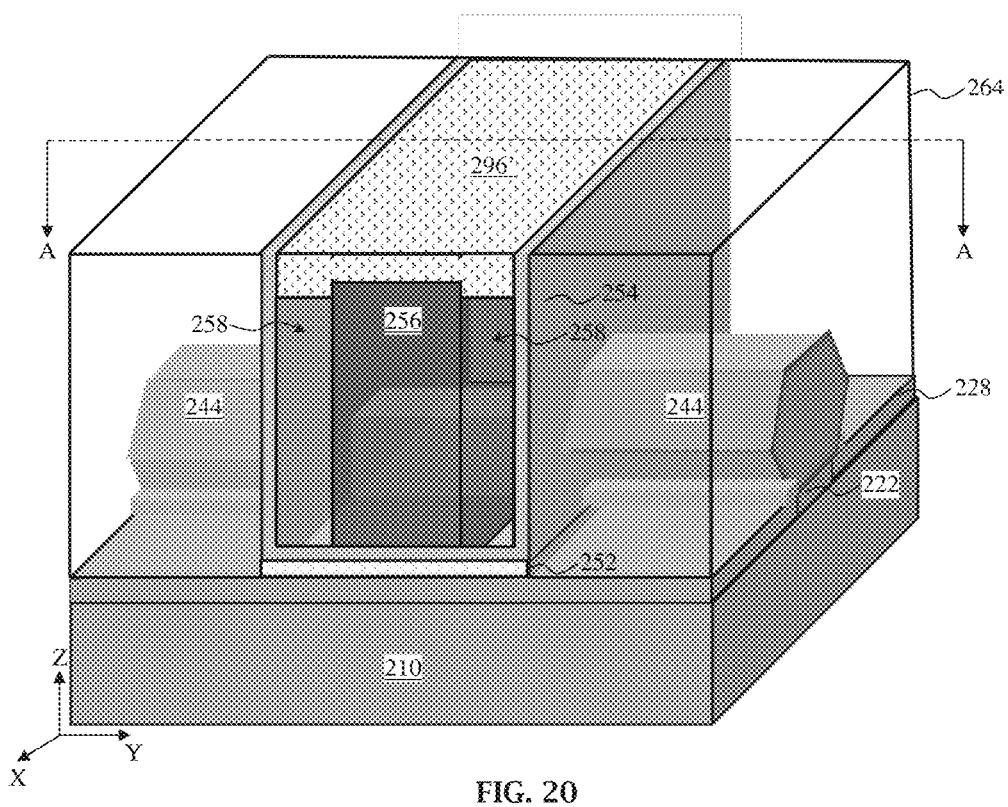
FIG. 20 is a fragmentary perspective view of the integrated circuit that includes the FinFET device of FIG. 18, in portion or entirety, during fabrication, such as that associated with the method of FIG. 1, according to various aspects of the present disclosure.

Turning to FIG. 19, fabrication can proceed with forming various interconnects of MLI feature 260 to facilitate operation of FinFET device 200. In some embodiments, one or more CESLs, such as a CESL 300 similar to CESL 262, and one or more ILD layers, such as an ILD layer 302 similar to ILD layer 264, are formed over substrate 210 (in particular, over ILD layer 264 and gate structure 250). In some embodiments, device-level contacts, vias, and/or conductive lines of MLI feature 260 are formed in the CESLs and ILD layers (e.g., CESLs 262, 300 and ILD layers 264, 302). Device-level contacts (also referred to as local interconnects or local contacts) electrically couple and/or physically couple IC device features to other conductive features of MLI feature 260 (for example, vias). Device-level contacts (also referred to as local interconnects or local contacts) include metal-to-poly (MP) contacts, which generally refer to contacts to a gate structure, such as a poly gate structure or a metal gate structure, and metal-to-device (MD) contacts, which generally refer to contacts to a conductive region of IC device 200, such as source/drain regions. In FIG. 19, MLI feature 260 is depicted with MD contacts, such as source/drain contacts 310, and an MP contact, such as gate contact 320. Source/drain contacts 310 extend through ILD layer 264 and CESL 262 to respective epitaxial source/drain features 244, and gate contact 320 extends through ILD layer 302, CESL 300, and gate air spacer seal 296' to gate electrode 256 of gate structure 250. Vias electrically couple and/or physically couple interconnect features in different levels (or layers) of MLI feature 260—for example, device-level contacts (disposed in a contact layer of MLI feature 260) to respective conductive lines. In FIG. 19, vias 330 extends vertically through ILD layer 302 and CESL 300 to physically and/or electrically couple source/drain contacts 310 to respective conductive lines (in some embodiments, disposed in a metal-1 (M1) layer of MLI feature 260). Fabrication can then continue to complete fabrication of MLI feature 260. For example, additional levels of MLI feature 260 can be formed over the M1 layer, such as an M2 layer to an Mn layer, where n represents a number of metal layers of MLI feature 260 and each of M2 layer to Mn layer include vias and conductive lines disposed in a dielectric material. Vias, similar to vias 330, can be fabricated to connect adjacent metal layers, such as M2 layer to M3 layer, etc. In some embodiments, one or more of the vias may connect non-adjacent metal layers.

Source/drain contacts 310, gate contact 320, vias 330, and conductive lines are formed by patterning ILD layers and/or CESLs (e.g., ILD layers 264, 302 and/or CESLs 262, 300). For example, patterning ILD layers 264, 302 and/or CESLs 262, 300 can include lithography processes and/or etching processes to form openings (trenches), such as contact openings, via openings, and/or line openings in respective ILD layers 264, 302 and/or CESLs 262, 300. In some implementations, the lithography processes include forming a resist layer over respective ILD layers 264, 302 and/or CESLs 262, 300 (or a hard mask layer disposed thereover), exposing the resist layer to patterned radiation, and developing the exposed resist layer, thereby forming a patterned resist layer that can be used as a masking element for etching opening(s) in respective ILD layers 264, 302 and/or CESLs 262, 300 (or the hard mask layer disposed thereover, which is then used as a mask for etching opening(s) in respective ILD layers 264, 302 and/or CESLs 262, 300). The etching processes include dry etching processes, wet etching processes, other etching processes, or combinations thereof. Thereafter, the opening(s) are filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. In some embodiments, source/drain contacts 310, gate contact 320, vias 330, and/or conductive lines include a bulk layer (also referred to as a conductive plug). In some embodiments, source/drain contacts 310, gate contact 320, vias 330, and/or conductive lines include a barrier layer, an adhesion layer, and/or other suitable layer disposed between the bulk layer and respective ILD layers 264, 302 (along with respective CESLs 262, 300). In such embodiments, the barrier layer and/or the adhesion layer conform to the contact opening, such that the barrier layer and/or the adhesion layer are disposed on respective ILD layers 264, 302 (along with respective CESLs 262, 300) and the bulk layer is disposed on the barrier layer and/or the adhesion layer. In some embodiments, the barrier layer, the adhesion layer, and/or other suitable layer include titanium, titanium alloy (for example, TiN), tantalum, tantalum alloy (for example, TaN), other suitable constituent, or combinations thereof. In some embodiments, via 220 and conductive line 230 include different bulk layers and/or different barrier layers. In some embodiments, source/drain contacts 310, gate contact 320, vias 330, and/or conductive lines include the same bulk layers and/or the same barrier layers. In some embodiments, source/drain contacts 310, gate contact 320, vias 330, and/or conductive lines include the different bulk layers and/or different barrier layers. In some embodiments, source/drain contacts 310, gate contact 320, vias 330, and/or conductive lines are formed by a dual damascene process. Thereafter, any excess conductive material(s) can be removed by a planarization process, such as a CMP process, thereby planarizing a top surface of ILD layers 264, 302 and/or CESLs 262, 300, source/drain contacts 310, gate contact 320, vias 330, and/or conductive lines.

From the foregoing description, it can be seen that integrating gate air spacers into gate structures of FinFETs, such as integrating gate air spacers 258 into gate structure 250, described in the present disclosure offer advantages over conventional FinFETs. It is understood, however, that other embodiments may offer additional advantages, and not all advantages are necessarily disclosed herein, and that no particular advantage is required for all embodiments. Because air has a dielectric constant that is about one (k≈1), which is lower than dielectric constants of insulating materials conventionally implemented in gate spacers (e.g., dielectric materials including silicon, oxygen, nitrogen, and/or carbon, such as silicon oxide, silicon nitride, and/or silicon carbide), gate air spacers 258 reduce a capacitance between gate electrode 256 and epitaxial source/drain features 244 and a capacitance between gate electrode 256 and source/drain contacts 310. In particular, since capacitance is proportional to a dielectric constant (k) of a material of a dielectric material of a capacitor, capacitance decreases by decreasing the dielectric constant of a dielectric material (here, by replacing gate dielectric spacers with gate air spacers 258) between gate electrode 256 and epitaxial source/drain features and gate electrode 256 and source/drain contacts 310. Decreases in the capacitance improves AC performance, reduces RC delay, and increases breakdown voltage (e.g., a minimum voltage that causes the dielectric material between gate electrode 256 and epitaxial source/drain features 244 and gate electrode 256 and source/drain contacts 310 to become electrically conductive), thereby improving performance and reliability of FinFET device 200. reduces improving AC performance. In some instances, gate air spacers 258 can also offset and/or compensate for parasitic capacitance arising from high-k dielectric layer 254. Fabrication of gate air spacers 258 is seamlessly integrated into current gate replacement processes and/or CMOS processes, and desired channel lengths for minimizing parasitic capacitance can be achieved during formation of epitaxial source/drain features 244 (e.g., by tuning the SSD etch to adjust depth and/or width of source/drain recesses and define channel length). The proposed integrated gate air spacers and corresponding methods of fabrication provide many advantages.

An exemplary transistor includes a fin and a gate structure disposed over the fin between a first epitaxial source/drain feature and a second epitaxial source/drain feature. The gate structure includes a gate electrode, a gate dielectric, and gate air spacers disposed between the gate dielectric and sidewalls of the gate electrode. The gate structure is free of gate dielectric spacers along sidewalls of the gate electrode. In some embodiments, the gate air spacers are disposed between the gate dielectric and a first portion of the sidewalls of the gate electrode. In such embodiments, the transistor further includes a gate air spacer seal disposed between the gate dielectric and a second portion of the sidewalls of the gate electrode. The second portion of the sidewalls of the gate electrode is disposed over the first portion of the sidewalls of the gate electrode. In some embodiments, the gate air spacer seal is further disposed over a top surface of the gate electrode. In some embodiments, the transistor further includes a gate contact that extends through the gate air spacer seal to the gate electrode. In some embodiments, a top surface of the gate dielectric is higher than a top surface of the gate electrode relative to a top surface of the fin. In some embodiments, the method further includes a dielectric layer disposed over the fin, the first epitaxial source/drain feature, and the second epitaxial source/drain feature, wherein the dielectric layer physically contacts sidewalls of the gate dielectric. In some embodiments, the dielectric layer includes an interlevel dielectric layer disposed over a contact etch stop layer. In some embodiments, a first portion of the contact etch stop layer is disposed between and physically contacts the gate dielectric and the first epitaxial source/drain feature and a second portion of the contact etch stop layer is disposed between and physically contacts the gate dielectric and the second epitaxial source/drain feature.

Another exemplary transistor includes a fin, a first epitaxial source/drain feature disposed in a first source/drain region of the fin, a second epitaxial source/drain feature disposed in a second source/drain region of the fin, and a gate structure disposed over the fin between the first epitaxial source/drain feature and the second epitaxial source/drain feature. The gate structure includes a gate electrode, a gate dielectric, and a gate air spacer seal. The gate structure further includes a first gate air spacer confined between the gate dielectric, a first sidewall of the gate electrode, and the gate air spacer seal, and a second gate air spacer confined between the gate dielectric, a second sidewall of the gate electrode, and the gate air spacer seal. The transistor further includes a gate contact that extends through the gate air spacer seal to the gate electrode. In some embodiments, a first edge and a second edge of the gate structure are defined by the gate dielectric. The first edge is substantially, vertically aligned with a first source/drain tip of the first epitaxial source/drain feature. The second edge is substantially, vertically aligned with a second source/drain tip of the first epitaxial source/drain feature. In some embodiments, the first gate air spacer and the second gate air spacer have a first thickness, the gate electrode has a second thickness, and the first thickness is less than the second thickness, such that the first gate air spacer is disposed along a portion of the first sidewall of the gate electrode and the second gate air spacer is disposed along a portion of the second sidewall of the gate electrode. In some embodiments, the portion of the first sidewall of the gate electrode is a lower portion of the first sidewall of the gate electrode and the portion of the second sidewall of the gate electrode is a lower portion of the second sidewall of the gate electrode. In such embodiments, the gate air spacer seal may also be disposed between and separate an upper portion of the first sidewall of the gate electrode and an upper portion of the second sidewall of the gate electrode. In some embodiments, the first gate air spacer and the second gate air spacer have a first thickness, the gate electrode has a second thickness, and the first thickness is substantially equal to the second thickness, such that the first gate air spacer is disposed along an entirety of the first sidewall of the gate electrode and the second gate air spacer is disposed along an entirety of the second sidewall of the gate electrode. In some embodiments, a dielectric layer of a multilayer interconnect feature disposed over the fin, the first epitaxial source/drain feature, the second epitaxial source/drain feature, and the gate structure. The dielectric layer is disposed between and physically contacts the first epitaxial source/drain feature and the gate dielectric and the dielectric layer is further disposed between and physically contacts the second epitaxial source/drain feature and the gate dielectric.

An exemplary method includes, after forming a first epitaxial source/drain feature and a second epitaxial source/drain feature, removing gate spacers from along sidewalls of a dummy gate stack disposed over a fin between the first epitaxial source/drain feature and the second epitaxial source/drain feature. The method further includes replacing the dummy gate stack with a metal gate stack. The metal gate stack includes a gate electrode disposed over a gate dielectric and a dummy spacer disposed between the gate dielectric and sidewalls of the gate electrode. The method further includes removing the dummy spacer from the metal gate stack to form a gate air spacer in the metal gate stack between the gate dielectric and the sidewalls of the gate electrode. The method further includes forming a gate air spacer seal over the gate air spacer. In some embodiments, replacing the dummy gate stack with the metal gate stack includes removing the dummy gate stack from a dielectric layer to form a gate opening defined in the dielectric layer that exposes the fin, and forming a gate dielectric layer that partially fills the gate opening. The gate dielectric layer is disposed over the dielectric layer and the fin. In such embodiments, replacing the dummy gate stack with the metal gate stack can further include forming a dummy spacer layer that partially fills the gate opening and forming a gate electrode layer that fills a remaining portion of the gate opening. The dummy spacer layer is disposed over the gate dielectric layer, and the gate electrode layer is disposed over the dummy spacer layer. In such embodiments, replacing the dummy gate stack with the metal gate stack can further include performing a planarization process on the gate electrode layer, the dummy spacer layer, and the gate dielectric layer. In some embodiments, the method further includes etching back the gate electrode before removing the dummy spacer from the metal gate stack to form the gate air spacer. In some embodiments, forming the dummy spacer layer includes depositing the dummy spacer layer over the gate dielectric layer, such that the dummy spacer layer is disposed over sidewalls of the gate opening defined by the dielectric layer and over a bottom of the gate opening defined by the fin. In such embodiments, forming the dummy spacer layer can further include forming a passivation layer over the dummy spacer layer disposed over the sidewalls of the gate opening defined by the dielectric layer and removing the dummy spacer layer disposed over the bottom of the gate opening defined by the fin to expose a portion of the gate dielectric layer that is disposed over the bottom of the gate opening defined by the fin. In such embodiments, forming the dummy spacer layer can further include removing the passivation layer. In some embodiments, the forming the passivation layer and the removing the dummy spacer layer includes performing a dry etch process. In some embodiments, the removing the passivation layer includes performing a wet etch process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a fin; and
   a gate structure disposed over the fin between a first epitaxial source/drain feature and a second epitaxial source/drain feature, wherein the gate structure includes:
      a gate electrode,
      a gate dielectric, and
      gate air spacers disposed between the gate dielectric and sidewalls of the gate electrode.

2. The transistor of claim 1, wherein the gate structure is free of gate dielectric spacers along sidewalls of the gate electrode.

3. The transistor of claim 1, wherein the gate air spacers are disposed between the gate dielectric and a first portion of the sidewalls of the gate electrode, the transistor further comprising a gate air spacer seal disposed between the gate dielectric and a second portion of the sidewalls of the gate electrode, wherein the second portion of the sidewalls of the gate electrode is disposed over the first portion of the sidewalls of the gate electrode.

4. The transistor of claim 3, wherein the gate air spacer seal is further disposed over a top surface of the gate electrode.

5. The transistor of claim 3, further comprising a gate contact that extends through the gate air spacer seal to the gate electrode.

6. The transistor of claim 1, wherein a top surface of the gate dielectric is higher than a top surface of the gate electrode relative to a top surface of the fin.

7. The transistor of claim 1, further comprising a dielectric layer disposed over the fin, the first epitaxial source/drain feature, and the second epitaxial source/drain feature, wherein the dielectric layer physically contacts sidewalls of the gate dielectric.

8. The transistor of claim 7, wherein the dielectric layer includes an interlevel dielectric layer disposed over a contact etch stop layer.

9. The transistor of claim 8, wherein a first portion of the contact etch stop layer is disposed between and physically contacts the gate dielectric and the first epitaxial source/drain feature and a second portion of the contact etch stop layer is disposed between and physically contacts the gate dielectric and the second epitaxial source/drain feature.

10. A transistor comprising:
    a fin;
    a first epitaxial source/drain feature disposed in a first source/drain region of the fin and a second epitaxial source/drain feature disposed in a second source/drain region of the fin;
    a gate structure disposed over the fin between the first epitaxial source/drain feature and the second epitaxial source/drain feature, wherein the gate structure includes:
       a gate electrode,
       a gate dielectric,
       a gate air spacer seal,
       a first gate air spacer confined between the gate dielectric, a first sidewall of the gate electrode, and the gate air spacer seal, and
       a second gate air spacer confined between the gate dielectric, a second sidewall of the gate electrode, and the gate air spacer seal; and
    a gate contact that extends through the gate air spacer seal to the gate electrode.

11. The transistor of claim 10, wherein:
    a first edge and a second edge of the gate structure are defined by the gate dielectric;

the first edge is substantially, vertically aligned with a first source/drain tip of the first epitaxial source/drain feature; and the second edge is substantially, vertically aligned with a second source/drain tip of the first epitaxial source/drain feature.

12. The transistor of claim 10, wherein:

the first gate air spacer and the second gate air spacer have a first thickness;

the gate electrode has a second thickness; and the first thickness is less than the second thickness, such that the first gate air spacer is disposed along a portion of the first sidewall of the gate electrode and the second gate air spacer is disposed along a portion of the second sidewall of the gate electrode.

13. The transistor of claim 12, wherein the portion of the first sidewall of the gate electrode is a lower portion of the first sidewall of the gate electrode and the portion of the second sidewall of the gate electrode is a lower portion of the second sidewall of the gate electrode; and the gate air spacer seal is disposed between and separates an upper portion of the first sidewall of the gate electrode and an upper portion of the second sidewall of the gate electrode.

14. The transistor of claim 10, wherein:

the first gate air spacer and the second gate air spacer have a first thickness;

the gate electrode has a second thickness; and the first thickness is substantially equal to the second thickness, such that the first gate air spacer is disposed along an entirety of the first sidewall of the gate electrode and the second gate air spacer is disposed along an entirety of the second sidewall of the gate electrode.

15. The transistor of claim 10, further comprising a dielectric layer of a multilayer interconnect feature disposed over the fin, the first epitaxial source/drain feature, the second epitaxial source/drain feature, and the gate structure, wherein the dielectric layer is disposed between and physically contacts the first epitaxial source/drain feature and the gate dielectric and the dielectric layer is further disposed between and physically contacts the second epitaxial source/drain feature and the gate dielectric.

16. A method comprising:

after forming a first epitaxial source/drain feature and a second epitaxial source/drain feature, removing gate spacers from along sidewalls of a dummy gate stack disposed over a fin between the first epitaxial source/drain feature and the second epitaxial source/drain feature;

replacing the dummy gate stack with a metal gate stack, wherein the metal gate stack includes a gate electrode disposed over a gate dielectric and a dummy spacer disposed between the gate dielectric and sidewalls of the gate electrode;

removing the dummy spacer from the metal gate stack to form a gate air spacer in the metal gate stack between the gate dielectric and the sidewalls of the gate electrode; and forming a gate air spacer seal over the gate air spacer.

17. The method of claim 16, wherein the replacing the dummy gate stack with the metal gate stack includes:

removing the dummy gate stack from a dielectric layer to form a gate opening defined in the dielectric layer that exposes the fin;

forming a gate dielectric layer that partially fills the gate opening, wherein the gate dielectric layer is disposed over the dielectric layer and the fin;

forming a dummy spacer layer that partially fills the gate opening, wherein the dummy spacer layer is disposed over the gate dielectric layer;

forming a gate electrode layer that fills a remaining portion of the gate opening, wherein the gate electrode layer is disposed over the dummy spacer layer; and performing a planarization process on the gate electrode layer, the dummy spacer layer, and the gate dielectric layer.

18. The method of claim 17, wherein the forming the dummy spacer layer includes:

depositing the dummy spacer layer over the gate dielectric layer, such that the dummy spacer layer is disposed over sidewalls of the gate opening defined by the dielectric layer and over a bottom of the gate opening defined by the fin;

forming a passivation layer over the dummy spacer layer disposed over the sidewalls of the gate opening defined by the dielectric layer;

removing the dummy spacer layer disposed over the bottom of the gate opening defined by the fin to expose a portion of the gate dielectric layer that is disposed over the bottom of the gate opening defined by the fin; and removing the passivation layer.

19. The method of claim 18, wherein:

the forming the passivation layer and the removing the dummy spacer layer includes performing a dry etch process; and the removing the passivation layer includes performing a wet etch process.

20. The method of claim 16, further comprising etching back the gate electrode before removing the dummy spacer from the metal gate stack to form the gate air spacer.

* * * * *